United States Patent [19]
Welles, II et al.

[11] Patent Number: 5,115,437
[45] Date of Patent: May 19, 1992

[54] INTERNAL TEST CIRCUITRY FOR INTEGRATED CIRCUITS USING TOKEN PASSING TO SELECT TESTING PORTS

[75] Inventors: Kenneth B. Welles, II, Scotia; Richard I. Hartley, Schenectady; Michael J. Hartman, Clifton Park, all of N.Y.

[73] Assignee: General Electric Company, Schenectady, N.Y.

[21] Appl. No.: 487,481

[22] Filed: Mar. 2, 1990

[51] Int. Cl.⁵ .............................................. G01R 31/28
[52] U.S. Cl. ................................... 371/22.5; 371/22.1
[58] Field of Search ................... 371/22.1, 22.3, 22.5, 371/15.1; 324/73.1, 158 R

[56] References Cited

U.S. PATENT DOCUMENTS

| | | | |
|---|---|---|---|
| 4,495,622 | 1/1985 | Charruau | 371/22.1 |
| 4,724,380 | 2/1988 | Burrows et al. | 371/22.5 |
| 4,764,926 | 8/1988 | Knight et al. | 371/22.5 |
| 4,837,765 | 6/1989 | Suzuki | 371/22.1 |
| 4,989,209 | 1/1991 | Littlebury et al. | 371/22.1 |

Primary Examiner—Charles E. Atkinson
Attorney, Agent, or Firm—Marvin Snyder; James C. Davis, Jr.

[57] ABSTRACT

Built-in test circuitry, which is appropriate for monolithic integrated circuit chips that are to be connected in a plural-chip package, uses electronic token passing to select one of the test input ports in the circuitry to be tested for application of test input vectors. The built-in test circuitry also uses electronic token passing to select one of the test output ports in the circuitry to be tested from which test results are to be supplied.

19 Claims, 10 Drawing Sheets

INTERNAL TEST CIRCUITRY FOR INTEGRATED CIRCUITS USING TOKEN PASSING TO SELECT TESTING PORTS

The invention relates to monolithic integrated-circuit chips provided with internal test circuitry, as can be packaged together in plural-chip integrated-circuit electronic systems.

RELATIONSHIP TO OTHER APPLICATIONS

This specification incorporates by reference U.S. Pat. No. 4,866,508 issued Sep. 12, 1989 to C. W. Eichelberger, K. B. Welles, II and R. J. Wojnarowski, entitled "INTEGRATED CIRCUIT PACKAGING CONFIGURATION FOR RAPID CUSTOMIZED DESIGN AND UNIQUE TEST CAPABILITY", and assigned to General Electric Company. A continuation application Ser. No. 363,646 of the same title was filed by the same inventors Jun. 8, 1989, contains claims to the testing circuitry and methods for a plural-chip integrated chip, and is assigned to General Electric Company. C. W. Eichelberger, R. J. Wojnarowski and the present inventors were all obligated to assign to General Electric Company their inventions at the time the inventions were made.

BACKGROUND OF THE INVENTION

U.S. Pat. No. 4,866,508 describes a plural-chip integrated circuit in which a number of monolithic integrated-circuit chips are flush-mounted in wells located on the surface of a common substrate and covered over with an insulating polyimide layer. These chips are connected to each other and to on-substrate metallization by High Density Interconnection (HDI) technology. The HDI connections are made through vias in the polyimide layer to bond pads as small as 25 microns across, which can be placed anywhere on the surfaces of the monolithic i-c chips or on the substrate; and connections can be made routing right over active portions of the integrated circuits by virtue of the intervening insulating polyimide layer. Up to four layers of metal interconnection separated by insulating polyimide layers may be used. A limited number of conventional-size bond pads allowing for plural-chip i-c pin-out are provided on the substrate.

Also described is the testing circuitry included within each monolithic i-c chip. Each chip includes a serial-in/parallel-out (SIPO) register for receiving a succession of test vectors supplied thereto in bit-serial form and for cyclically applying that succession of test vectors in bit-parallel form, either to the input ports of the chip or to each output port of each preceding chip as selected by test mode signals. Each chip includes a parallel-in/serial-out (PISO) register for receiving test results in parallel-bit form, either from the output ports of the chip or from each input port of each succeeding chip as selected by test mode signals, and converting the test results to bit-serial output form. The SIPO registers on the chips are also provided with serial-out capabilities, permitting their cascade interconnection as an extended shift register, through which test vectors supplied in serial form may be successively written to each of the SIPO registers. Similarly, the PISO registers on the chips are also provided with serial-in capabilities, permitting their cascade interconnection as another extended shift register, through which test results may be successively read in serial form from each of the PISO registers.

A problem encountered in testing using the approach described in U.S. Pat. No. 4,866,508 is that access times become excessively long as the number of chips in a plural-chip integrated circuit increases, especially if the number of ports being tested per chip increases, causing increases in the lengths of the extended shift registers used for writing in test vectors to a test input port on one of the chips in the digital electronics system and for reading out test results from a test output port on that chip or another. Testing is usually carried out by isolating chunks of electronic circuitry located in respective portions of one or more monolithic integrated circuits and then subjecting the chunks to testing one at a time. (In interconnection testing, a pair of chunks at opposite ends of an interconnection are selected for testing at any one time). The successive input test patterns each have to be clocked completely through the cascaded SIPO registers for test input data before the next test pattern is entered. So substantial time is taken up during testing just to properly locate input test data in the cascade connection of SIPO registers for test input data. There is the further problem of the shifting of test output results from an extended PISO register adding to the time taken up by testing.

The problem of the extended times for testing a chunk at a time can be avoided by testing several chunks, in parallel, at the same time. However, this undesirably complicates the design of programs for automatically generating test sequences working from a software description of digital system internodal connections. To simplify the design of such programs, it is highly desirable to be able to specify on a selective-access basis the ports in a digital electronics system to which test input data are to be applied in bit-serial form and from which test output results are to be taken in bit-serial form.

Such selective access can be provided by some form of multiplexing to ports for applying test input data and from ports for sensing test output responses, it can be postulated. The problem is to develop multiplexing circuitry for test input data and test output results that can be extended over as many portions of digital electronic systems as one may seek to test. It is desirable to use local switching circuitry for multiplexing the SIPO test input data registers. It is also desirable to use local switching circuitry for multiplexing the test output results in real time, so as to be able to avoid the delays occasioned by the use of PISO test output data registers.

A method of providing for multiplexing used in the data communication arts is token passing, wherein local switching circuits pass among them a token (e.g., a logic ONE electric signal) possession of which grants access to a shared communications channel. Schemes are known in which transceiver stations pass only one token among themselves to determine which single transceiver shall be able to transmit data over the shared communications channel, with all transceivers not possessing the token being conditioned only to receive data. Plural token passing schemes are also known. In one such scheme transceivers pass two tokens along separate paths, the first token determining which single transceiver can transmit over the channel and the second token determining which single transceiver can receive the transmission. Plural token passing schemes are known where the path for passing the second token can contain further tokens enabling selected transceivers to receive. Relaying schemes are known where the transceivers use one communications channel and pass both the first token enabling reception and the second token enabling transmission along the same path, one after the other. None of these prior-art token passing schemes in which a shared communications channel is used simultaneously by a plurality of transceivers is appropriate for use in testing selected portions of an electronics system.

Token passing is utilized in the invention for controlling the multiplexing of bit serial input data to portions of an electronics system under test and for controlling the multiplexing of bit-serial test results from portions of the electronics system under test, so the switching circuitry for carrying out the multiplexing of each portion of the electronics system can be local. During testing there are two channels being assigned using respective tokens. One channel is used for controlling the application of test signals and sequencing of testing and the other channel is used for extracting test results. A single portion of the electronics system under test uses both channels and does not communicate to other portions of the electronics system.

A plural-dimension addressing scheme devised by the inventors uses token passing to select the monolithic integrated circuit involved in testing (or pair of circuits interconnections between chunks involved in testing) and uses additional token passing to select the specific chunk (or pair of chunks) involved in testing.

Token passing involves a positional code and requires considerably more bits than a binary number code to indicate a selection. The shift register for implementing token passing to determine which of a set of successive ports is to be tested has reduced latency as compared to the extended test input data SIPO register, however, to and the extended test output result PISO register as well. This is because the token is normally only one bit or a few bits long, rather than several bits long as is the case with test input data and test output results. The use of binary number codes to control local switching circuitry forming the multiplexers is possible, as already noted, but the number of control lines required to convey the binary number bits in parallel is larger than one would like. Bit-serial transmission schemes for the binary number codes tend to involve the latency problem in another form, especially if the codes are made self-parsing to avoid the need for two control lines.

SUMMARY OF THE INVENTION

The objective of the invention is to allow for the speeding up the accessing of test ports in the electronics system and components thereof, by avoiding extended serial-in/parallel-out (SIPO) registers for test input data and extended parallel-in/serial-out (PISO) registers for test output results, as employed in prior art approaches to test circuitry. The invention uses port-to-port multiplexing of test input data directly to the serial input port of a selected one of individual SIPO registers associated with different test input ports, rather than using time-division multiplexing of test input data to a concatenation of the individual SIPO registers. The invention also uses bit-selection multiplexing of test output data directly from a selected one of the output ports of chunks of electonic circuitry within a selected integrated circuit, rather than using time-division multiplexing of output data from a concatenation of the individual PISO registers. The port-to-port multiplexing and the bit-selection multiplexing are each accomplished using local switching circuitry controlled by token passing. A monolithic integrated circuit including circuitry to be tested also includes, in accordance with the invention, internal test circuitry having connections from a serial test feed line to a test output line, from a test clock line and from instruction lines. The internal test circuitry includes means for receiving, storing and passing a first token that selects the internal test circuitry to the serial test feed line. The internal test circuitry includes means for receiving, storing and passing a second token that selects the internal test circuitry to the test output line. A first shift register and a second shift register have their respective serial data input ports connected from the serial test feed line. The first shift register has a parallel data output port selected to a data input port of the circuitry to be tested only during the times the first token is stored in the means for receiving, storing and passing that first token. The second shift register has a parallel data output port for controlling the selection to the test output line, of a specified bit from a data output port of the circuitry to be tested. Test clock signal is selectively applied to the first and second shift registers as controlled by instructions received via the instruction lines.

DETAILED DESCRIPTION

Digital electronics systems with built-in test circuitry may be constructed by high density interconnection (HDI) of monolithic integrated circuits mounted on a common substrate, as described above in the "Background of Invention". Implementation of such systems is faciliated by the monolithic integrated circuits being constructed to a standard with regard to their respective built-in test circuitry, which standard can be one of the types described further on in this specification. The portion of the electronics system included within such a chip is usually subdivided into chunks of electronic circuitry that one wishes to test individually, each of which chunks has during normal operation at least one respective output port for digital signal, and many of which chunks each have during normal operation at least one respective input port for digital signal. If a chunk has more than one input port during normal operation, usually these input ports are aligned with each other to form a single input port of extended bit width for testing. If a chunk has more than one output port during normal operation, usually these output ports are aligned with each other to form a single output port of extended bit width for testing, the bits of which port are polled one after the other.

Figure 1:
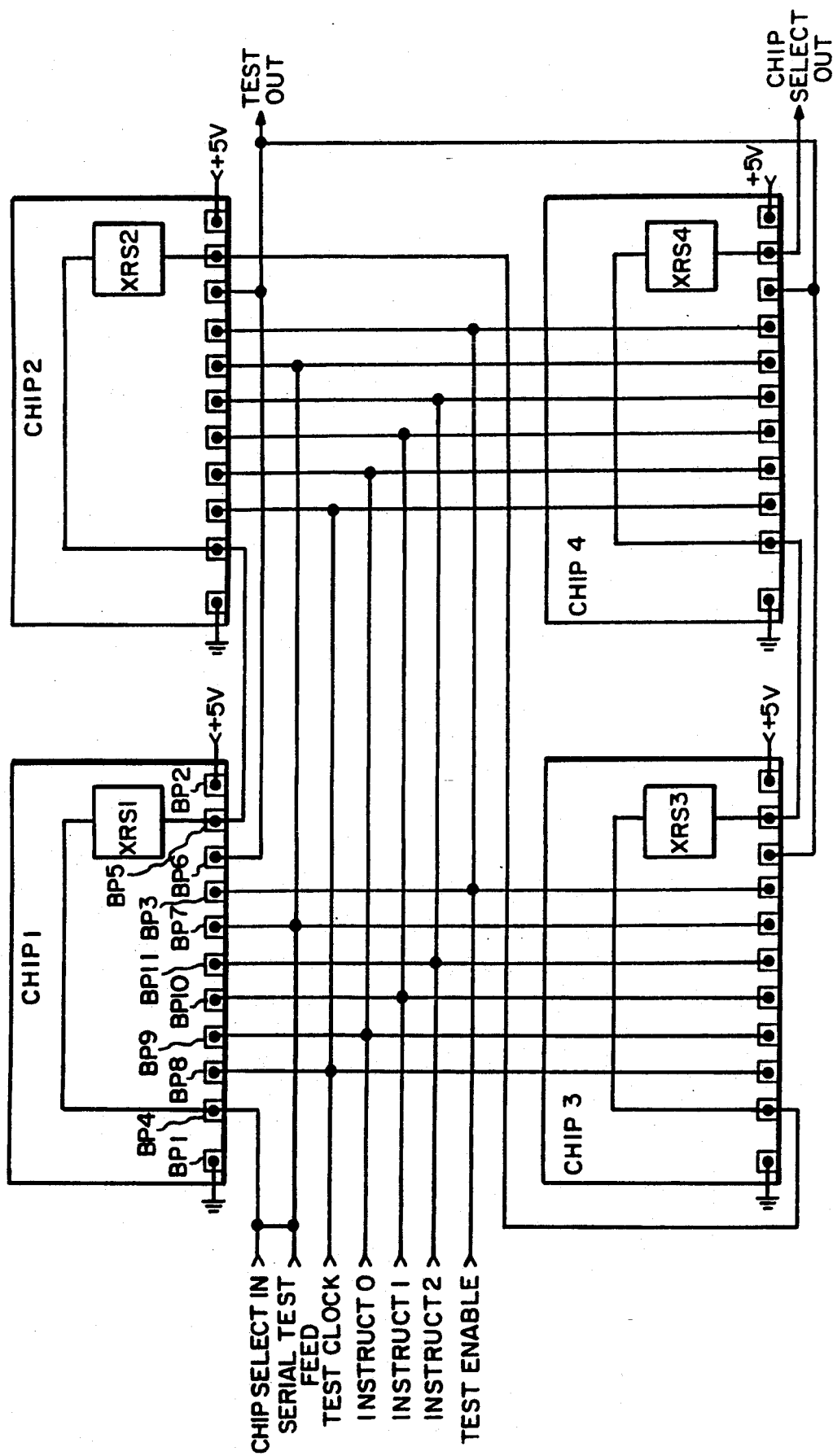
FIG. 1 is a block schematic diagram of a plural-chip integrated circuit formed by mounting on a common substrate a plurality of monolithic integrated-circuit chips each of which has built-in test circuitry in accordance with an aspect of the invention, showing the interconnections of those monolithic integrated circuits in accordance with a further aspect of the invention.

FIG. 1 shows a digital electronics system that is a plural-chip integrated circuit having four monolithic integrated circuit chips CHIP1, CHIP2, CHIP3 and CHIP4. Each of these chips has full-size bond pads (indicated by small squares) at standardized locations therein and contains standardized built-in test circuitry (not specifically shown). Relatively negative (0 V.) and relatively positive (+5 V.) operating voltages are applied in parallel to first and second full-sized bond pads BP1 and BP2 respectively of each of the chips CHIP1, CHIP2, CHIP3 and CHIP4 of the FIG. 1 plural-chip integrated circuit during its testing, which application of operating voltages may also be done during normal operation of the plural-chip integrated circuit. A TEST ENABLE bus connects to each of the chips CHIP1, CHIP2, CHIP3 and CHIP4 for applying to them a mode-controlling TEST ENABLE signal, which TEST ENABLE signal has a first state during testing and has a second state during normal operation. In the standardized testing circuitry developed by the inventors these first and second states are logic ONE and logic ZERO, respectively. A TEST CLOCK bus connects to each of the chips CHIP1, CHIP2, CHIP3 and CHIP4. The TEST CLOCK bus is supplied a square wave, transitions of which are used to synchronize the respective generation on each of these chips of non-overlapping plural phases of clocking signal. Alternatively, to avoid the need for generating non-overlapping two-phase clocking signal on each monolithic integrated circuit chip, two TEST CLOCK lines may be used to distribute non-overlapping two-phase clocking signal to all the chips. A SERIAL TEST FEED bus connects to each of the chips CHIP1, CHIP2, CHIP3 and CHIP4. Data for controlling the generation of test input vectors, for controlling the application of those test input vectors, and for controlling the bit selection of test output results are applied, on a time-division-multiplexed basis, in serial form via the SERIAL TEST FEED bus. A TEST OUT bus connects from each of the chips CHIP1, CHIP2, CHIP3 and CHIP4 for receiving the test output results of a selected one of them in serial form.

Time-division-multiplexed testing of CHIP1, CHIP2, CHIP3 and CHIP4 is controlled responsive to token signals passed to each in turn through an extended shift register, the zeroeth shift register, a respective segment of which extended or zeroeth shift register is located in each of the chips. The zeroeth shift register extends from a SELECT IN terminal to a SELECT OUT terminal, and comprises the cascaded segments XRS1 (in CHIP1), XRS2 (in CHIP2), XRS3 (in CHIP3) and XRS4 (in CHIP4). Depending on one's desires, the SELECT IN terminal can be connected to the SERIAL TEST FEED terminal, as shown, or can be kept apart from the SERIAL TEST FEED terminal.

A plural-line INSTRUCTION bus for carrying respective bits of plural-bit instruction codes connects to each of the chips CHIP1, CHIP2, CHIP3 and CHIP4. FIG. 1 shows an INSTRUCTION bus comprising three lines INSTRUCT0, INSTRUCT1 and INSTRUCT2. One of the instruction codes controls the selective clocking of the zeroeth, extended shift register. Another of the instruction codes controls the successive selection to the TEST OUT bus of the bits of the output test results that are generated in parallel in the one of the chips CHIP1, CHIP2, CHIP3 and CHIP4 that is selected, or enabled, for testing by a CHIP OUTPUT ENABLE token passed via the zeroeth, extended shift register. Certain other of the instruction codes control demultiplexing of serial data on the SERIAL TEST FEED bus within the one of the chips CHIP1, CHIP2, CHIP3 and CHIP4 selected, or enabled, for testing by a CHIP SELECT token passed via the zeroeth, extended shift register.

Consider now the circuitry, especially the built-in test circuitry, which is to be found within each of the chips CHIP1, CHIP2, CHIP3 and CHIP4 of FIG. 1 and other chips of a standard type. This circuitry as found on one such chip CHIP 1 comprises that shown in FIGS. 2-6. (The FIG. 6 portion of the circuitry is a reiteration of the FIG. 5 portion of the cicuitry, which FIG. 5 portion of the circuitry is generally replicated serveral fold.) This circuitry shown in FIGS. 2-6 uses token passing to address the test input ports and test output ports in both chip-selection and chunk-selection dimensions. Token passing in the zeroeth, extended shift register selects the chip containing the test input port, and further token passing selects the chunk containing the test output port.

Figure 2:
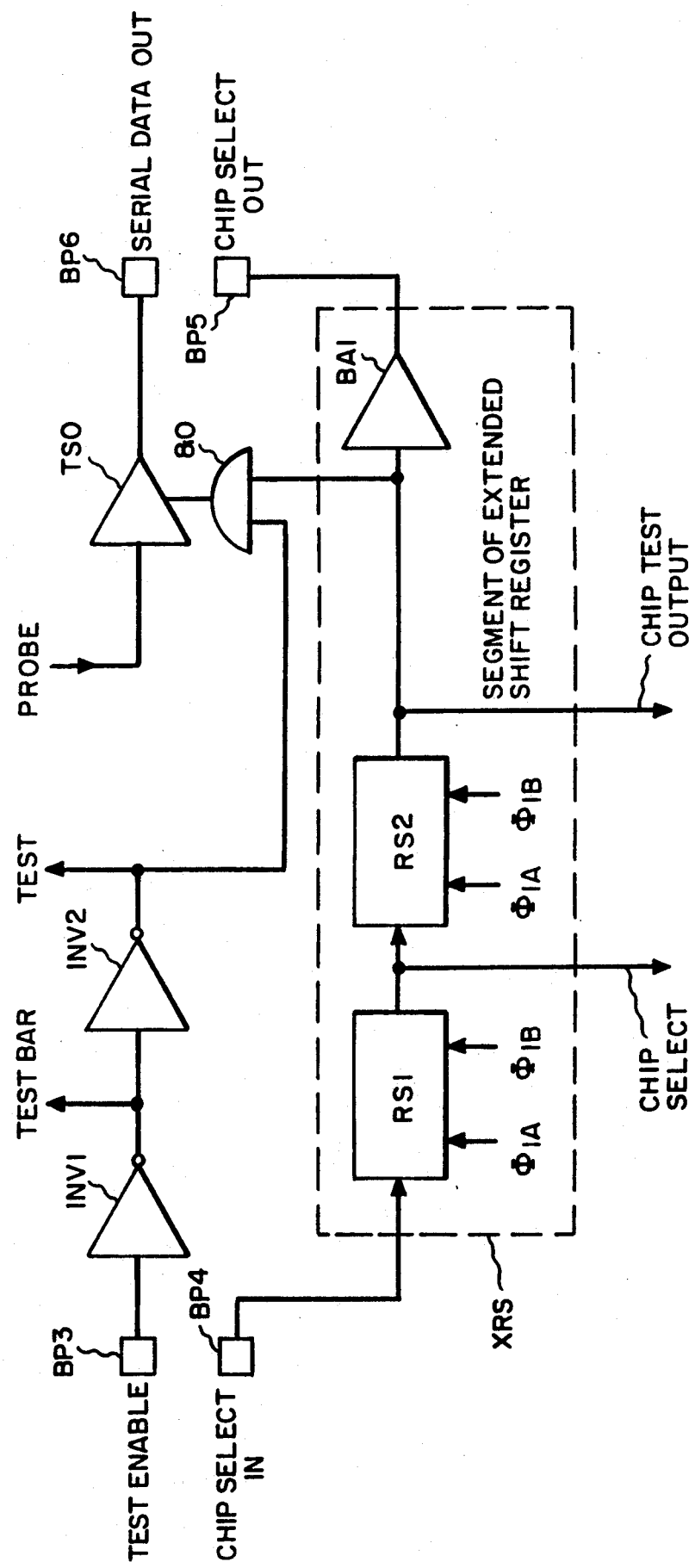
FIGS. 2, 3, 4, 5 and 6 are block schematic diagrams of respective portions of the built-in test circuitry in a monolithic integrated circuit that embodies an aspect of the invention.

FIG. 2 shows a third full-size bond pad BP3 located on the chip, connected from the TEST ENABLE bus, and connected to the input port of a logic inverter INV1. Logic inverter INV1 responds to TEST ENABLE signal supplied via TEST ENABLE bus to generate a complementary TESTBAR signal at its output port. TESTBAR signal is applied to the input port of a further logic inverter INV2 which provides at its output port buffered TEST signal complementary to TESTBAR. The use of the TEST and TESTBAR signals in other circuitry on the chip will be explained further on in this specification. A fourth full-sized bond pad BP4 and a fifth full-size bond pad BP5 include between them a segment XRS of the zeroeth, extended shift register. The extended shift register segment XRS comprises, in cascade connection, shift register stages RS1 and RS2 and a buffer amplifier BA1. A logic ONE in the initial shift stage RS1 provides a CHIP SELECT token to circuitry in FIG. 3, to enable the selective generation of two-phase clock signals $\Phi_{3A}$ and $\Phi_{3B}$ for a first shift register SR1 that stores at least one input test vector, two-phase clock signals $\Phi_{5A}$ and $\Phi_{5B}$ for a third shift register SR3 that stores a test vector mask, and two-phase clock signals $\Phi_{6A}$ and $\Phi_{6B}$ for a fourth shift register SR4 that stores CHUNK SELECTION token signals for a plurality of chunks M in number.

Figure 3:
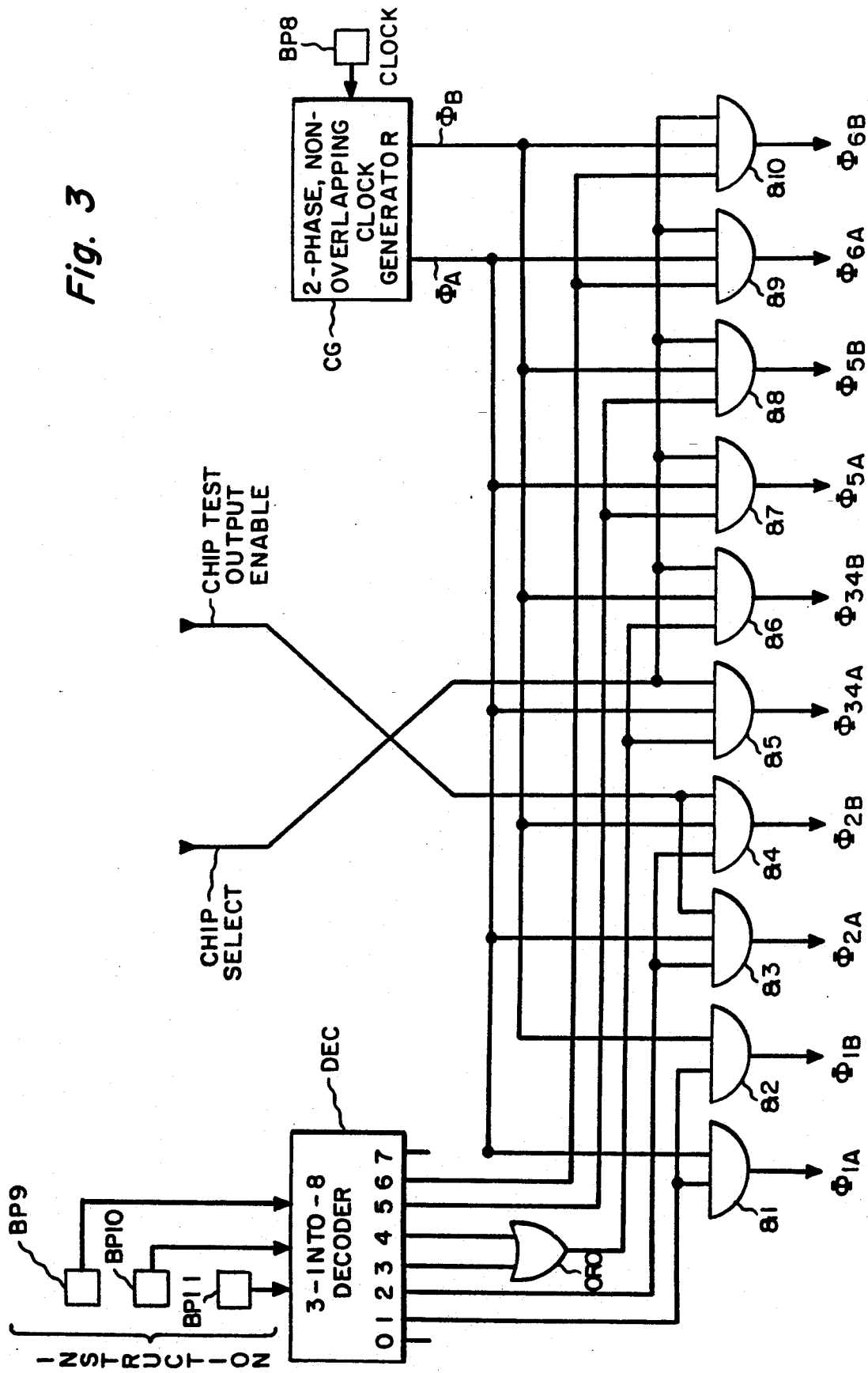
Figure 4:
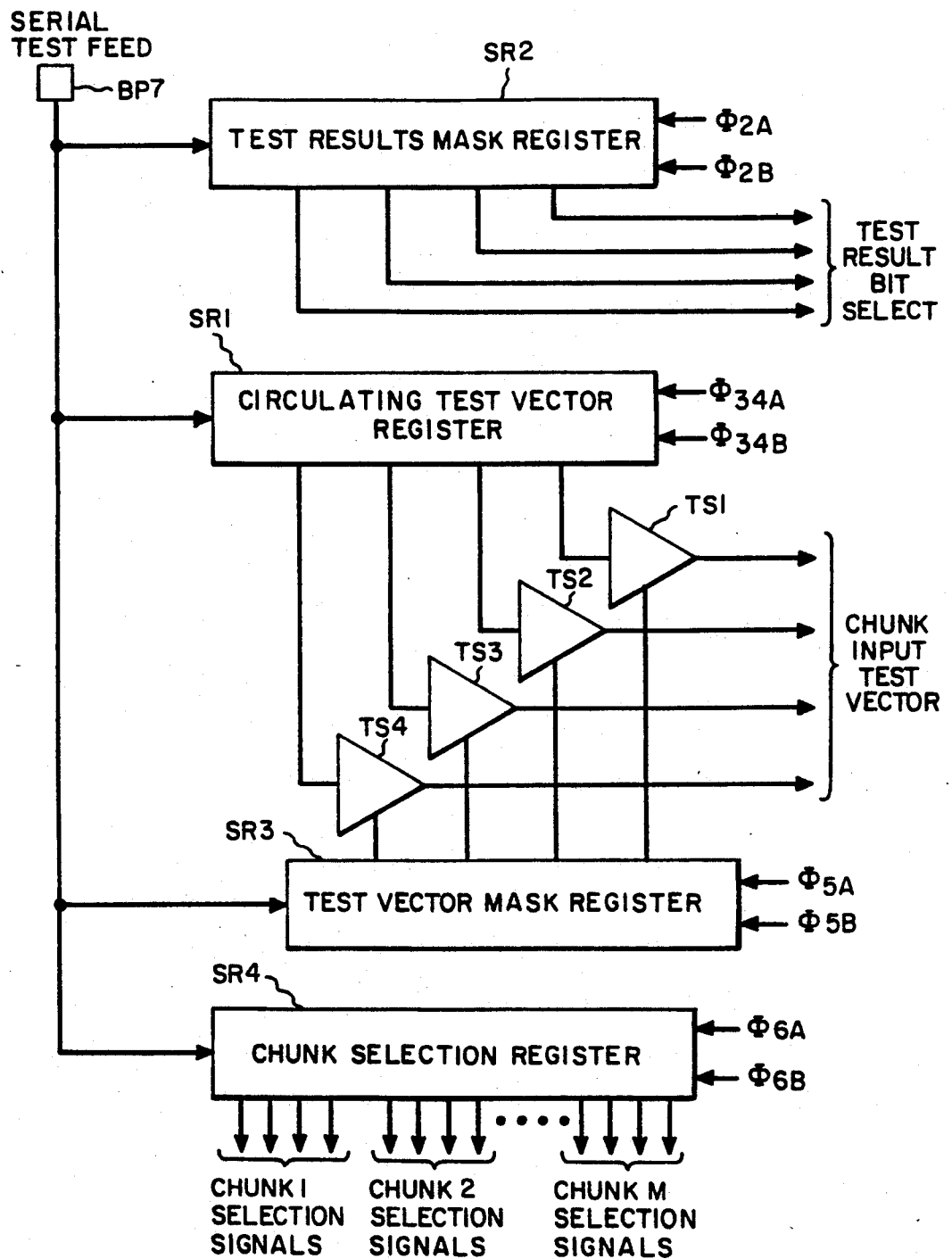
Figure 5:
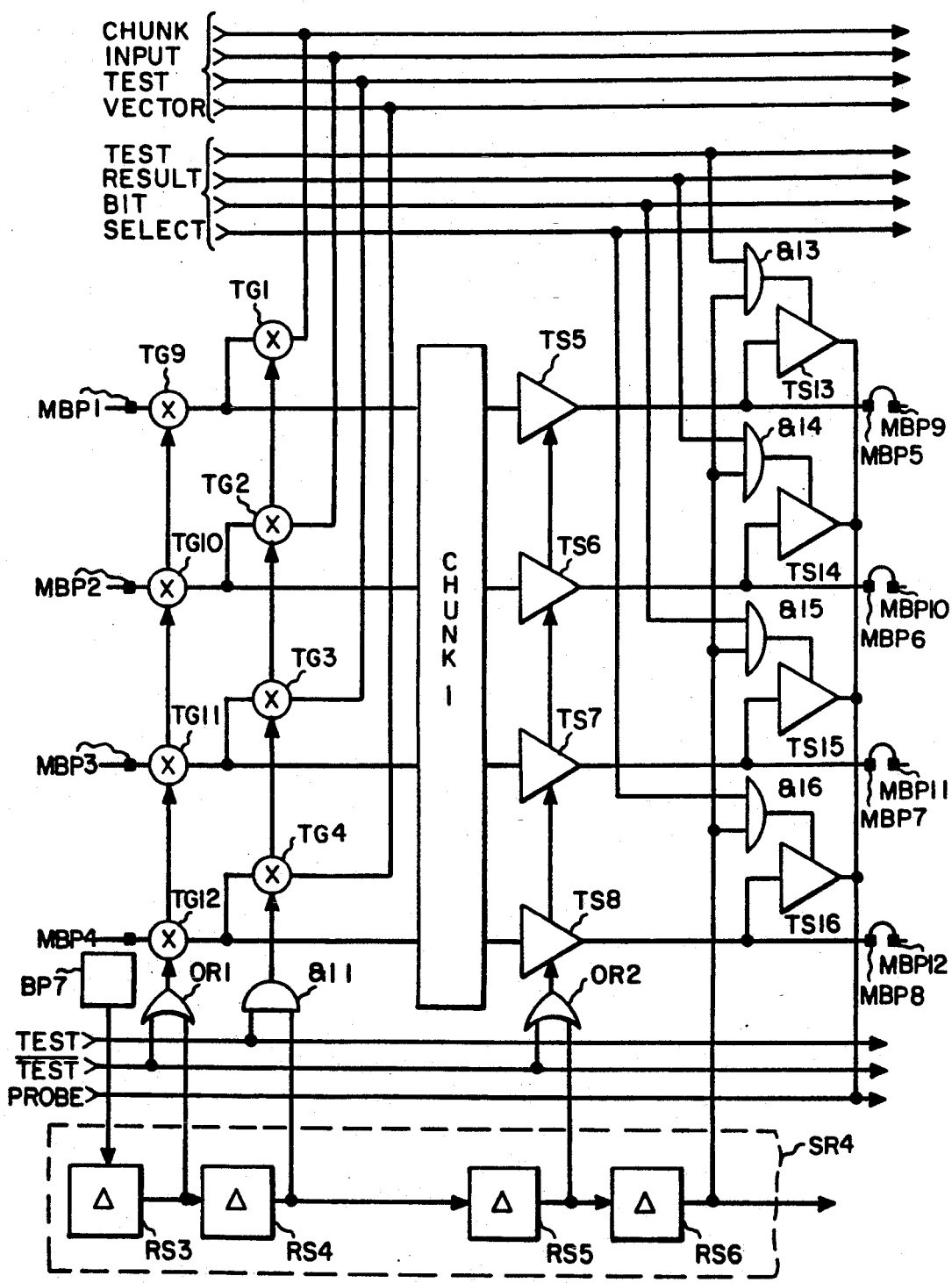
Figure 6:
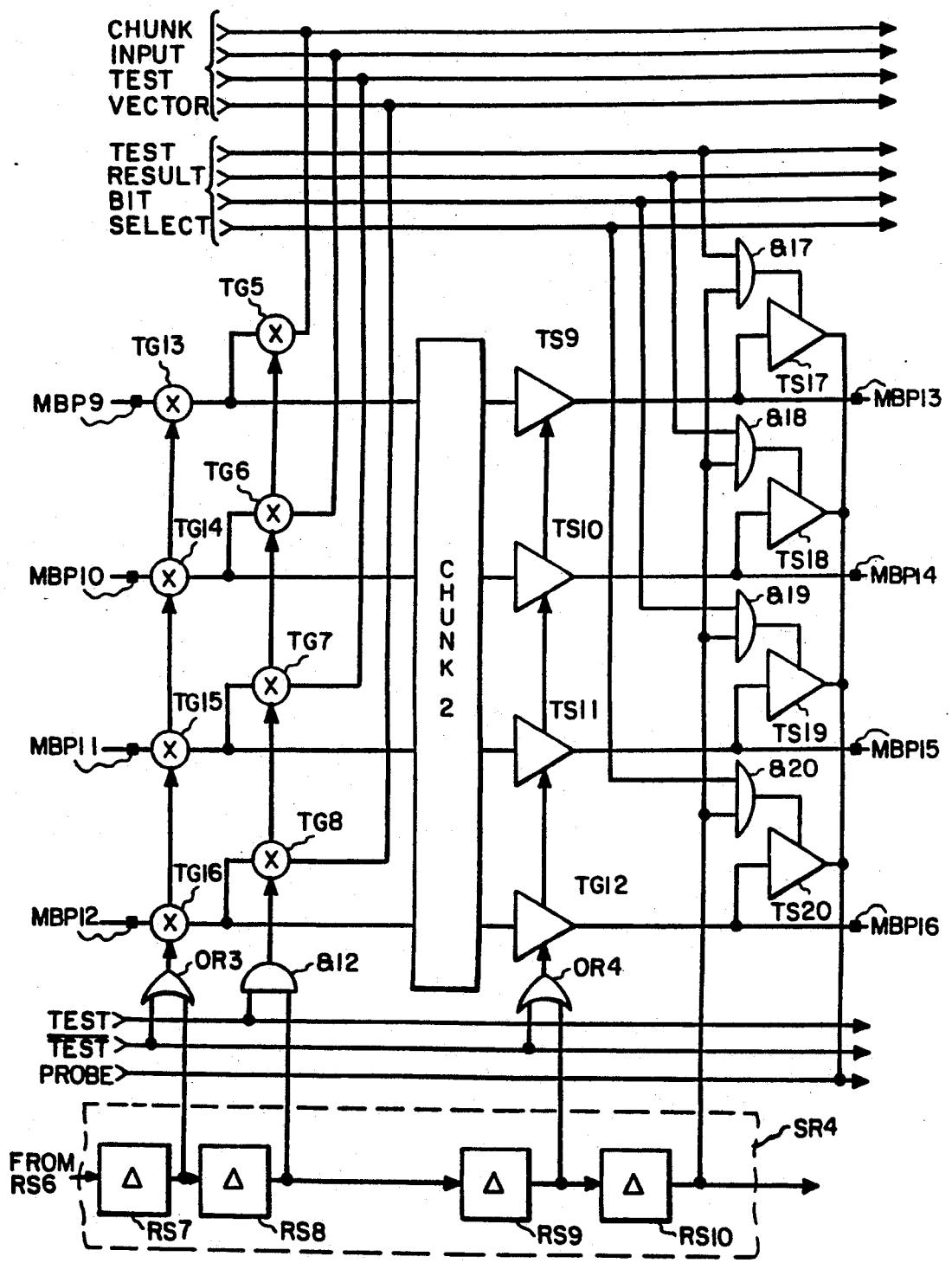

In FIG. 2 a logic ONE in the final shift stage RS2 provides a CHIP TEST OUTPUT ENABLE token to circuitry in FIG. 3 therein to enable the selective application of clock signals to the second shift register SR2 in FIG. 4, which stores a test result mask that is used to select which bit of the test output port of a selected chunk is supplied to a PROBE bus. In FIG. 2 the CHIP TEST OUTPUT ENABLE signal and the TEST ENABLE signal concurrently being logic ONEs causes a logic ONE response from an AND gate &0. The ONE response from AND gate &0 conditions a powerful tristate driver TS0 to apply, to a full-size bond pad BP6 connected to the TEST OUT bus, the logic condition on the PROBE bus to which the output connections of chunks of electronic circuitry are polled. This polling is done using procedures that will be described in more detail when FIGS. 5 and 6 are considered in detail.

FIG. 4 shows shift registers SR1, SR3 and SR4 and another shift register SR2 that stores a test result mask. The CHIP SELECT token enables the selective loading of serial input data applied to a full-size bond pad BP7 in FIG. 4 to shift registers SR1, SR2, SR3 and SR4 of the chip under consideration and enables the subsequent shifting of that data through these registers.

The first shift register SR1 is preferably of a type that can store a plurality, p in number, of input test vectors and could as described in U.S. Pat. No. 4,866,508 consist of a shift register providing parallel data output signal from every $p^{th}$ one of successive shift register stages. As will be described further on, in reference to FIG. 7, such a shift register can be modified so as to permit electrically controlled reconnection of its shift stages in a plurality of looped shift register connections, each having p shift stages therein. This permits the plurality of p input test vectors to be circulated in their application to test input ports of the circuitry to be tested.

During the testing of interconnections between circuitry chunks only one bit position at a time in the interconnection under test is to be driven with the bits of input test vectors stored in the first shift register SR1. Accordingly, as shown in FIG. 4, the application of the bits of test vectors from the parallel data output port of register SR1 to the input port or paralleled input ports of each electronic circuitry chunk on the chip is selectively made from low source impedances using tristate drivers TS1, TS2, TS3, TS4, etc. The source impedances appearing at the output ports of the tristate drivers TS1, TS2, TS3, TS4, etc. are controlled by the logic conditions stored in respective stages of the third shift register SR3. Each stage of the third shift register SR3 either: holds a ONE to condition a respective one of these tristate drivers to apply its response at relatively low impedance to the electronic circuitry chunks, or holds a ZERO to condition that respective tristate driver to exhibit relatively high impedance to the electronic circuitry chunks. The pattern of ONEs and ZEROs in the shift register SR3 is a mask for applying test vectors. The mask has a ZERO at each position corresponding to a connection to an input port of a chunk under test that is to be driven from relatively high source impedance, and the mask has a ONE at each position corresponding to a connection to the input port of the chunk under test that is to be driven from a relatively low source impedance.

The fourth shift register SR4, shown in FIG. 4 is a part of the chunk selection circuitry for isolating each chunk of electronic circuitry and testing its response. This circuitry will be described in detail further on in this specification, referring to FIGS. 5 and 6.

In a digital electronics system to be tested having the built-in test circuitry, the shift register stages in the respective segments of a zeroeth shift register on the component chips are connected in cascade to form the extended zeroeth shift register for passing token signals, as noted in regard to FIG. 1. In the circuitry of FIG. 2 (and FIGS. 3–6) these CHIP SELECT and CHIP OUTPUT ENABLE token signals, each a respective logic ONE bit, are usually applied by a conventional tester one after the other during successive TEST CLOCK cycles to the SELECT IN port of the zeroeth, extended shift register and clocked forward by the selective application of clocking signals to the segment XRS and other segments of that extended shift register. This selective application of clocking signals is done responsive to the first plural-bit instruction code being applied to the INSTRUCT0, INSTRUCT1 and INSTRUCT2 lines of the INSTRUCTION bus. When doing functional testing, the two ONEs repose in the shift stages RS1 and RS2 of the chip on which the chunk being tested is located. When testing the HDI interconnections between two chuncks on the same chip, using a succession of test vectors applied one bit at a time, the two successive ONEs also repose in the shift stages RS1 and RS2 of the chip being tested. A logic ONE in shift stage RS1 is a first token, which is a CHIP SELECT signal that enables the selective application of test vectors to the chip selected by its possession of that first token. A logic ONE in shift stage RS2 is a second token, which is a CHIP TEST OUTPUT ENABLE signal that enables the selective extraction of test results from the chip selected by its possession of that second token.

The chunk selection circuitry, which is shown in FIGS. 5 and 6 and will be described in detail further on in this specification, provides for isolating each chunk of electronic circuitry and testing its response. The chunk selection circuitry also provides for testing HDI interconnections between a preceding chunk of electronic circuitry and a succeeding chunk, by driving test values from the input port of the succeeding chunk of electronic circuitry to the output port of the preceding chunk in accordance with the testing philosophy set forth by C. W. Eichelberger, K. B. Welles, II and R. J. Wojnarowski in the references cited above.

When testing the high-density interconnections from the output port of a chunk on a first chip to the input port of a chunk on a second chip, a ZERO and a ONE are stored in the successive stages of the zeroeth shift register segment on the first chip and a ONE and a ZERO are stored in the successive stages of the zeroeth shift register segment on the second chip. Where the chunks on the first chip are in a pipeline that continues through the chunks on the second chip, connection of the SELECT OUT port of the zeroeth shift register segment in the first chip directly to the SELECT IN port of the zeroeth shift register segment in the second chip permits the passing of the pair of successive ONEs when sequentially performing all testing procedures on the pipeline.

When logic flow through a network is not restricted to non-branching pipelines, a pair of separate ONEs with appropriate numbers of ZEROs therebetween will have to be passed through the zeroeth, extended shift register. In the design of chips for implementing a digital electronics system, a consideration that can be made is the partitioning of the system among the chips to reduce the number of special patterns of token signals required for chip selection, possibly controlling the testing of a plurality of different chip-to-chip high-density interconnections by using a single special token pattern differently positioned in the zeroeth, extended shift register.

In FIG. 3 a clock generator CG receives a square-wave signal applied to an eighth full-sized bond pad BP8 via TEST CLOCK bus and generates plural phases of clocking signal that are selectively applied to parts of the built-in test circuitry to control its operation. This clocking signal can be separate from clocking signals that are employed during normal operation and are applied to the chip via its HDI bond pads. In embodiments of the invention using shift register stages as shown in FIGS. 4–6, clock generator CG generates two phases $\Phi_A$ and $\Phi_B$ of clocking signal that are respectively logic ONE during alternate non-overlapping time periods and that are otherwise logic ZERO. Alternatively, to avoid the need for generating non-overlapping two-phase clocking signal on each monolithic integrated circuit chip, as noted previously, two TEST CLOCK lines may be used to distribute non-overlapping two-phase clocking signal to all the chips.

The three-into-eight decoder DEC in FIG. 3 provides response to eight instruction codes received via the INSTRUCT0, INSTRUCT1 and INSTRUCT2 instruction lines, compliance with only the first of which codes has been thus far considered. A representative set of eight instruction codes and their corresponding instructions is tabulated immediately hereafter.

| CODE | INSTRUCTION |
|---|---|
| 000 | Reserved For other use |
| 001 | Shift the contents of the shift stages in the clocked CHIP SELECT bus storing CHIP SELECT and CHIP TEST OUPUT ENABLE bits and load new bits serially into the zeroeth, extended shift register. |
| 010 | Shift contents of the second shift register SR2 storing OUTPUT TEST RESULT MASK bits and load new bits serially into the second shift register SR2. |
| 011 | Load new bits serially from said SERIAL TEST FEED bus into the first shift register SR1 storing input test vectors. |
| 100 | Circulate the input test vectors stored in first shift register SR1, for testing chunk functionality or high-density interconnection. |
| 101 | Shift contents of the third shift register SR3 storing INPUT TEST VECTOR MASK bits and load new bits serially into the third register SR3. |
| 110 | Shift contents of the fourth shift register SR4 storing CHUNK SELECT SIGNAL bits and load new bits serially into the fourth register SR4. |
| 111 | Reserved for other use |

The first instruction is unconditionally followed in all chips receptive thereof to selectively generate $\Phi_{1A}$ and $\Phi_{1B}$ phases of clocking signal for application to the respective zeroeth extended shift register segment XRS comprising shift register stages RS1 and RS2 followed in cascade by buffer amplifier BA1. The instructions associated with codes 010, 011, 100, 101 and 110 are conditionally followed in each chip receptive thereof. In FIG. 3 AND gates &3 and &4 respond to $\Phi_A$ and $\Phi_B$ clocking signal phases to supply $\Phi_{2A}$ and $\Phi_{2B}$ to the second shift register SR2 of FIG. 4 only if the CHIP OUTPUT ENABLE signal stored in shift register stage RS2 is a ONE, as well as the second instruction code 010 being supplied to decoder DEC from the INSTRUCT0, INSTRUCT1 and INSTRUCT2 lines of the INSTRUCTION bus via full-size bond pads BP9, BP10 and BP11. In FIG. 2 either the third instruction code 011 or the fourth instruction code 100 causes an OR gate OR0 after decoder DEC to supply a ONE to AND gates &5 and &6. The CHIP SELECT signal from shift register stage RS1 must also be a ONE to enable AND gates &5 and &6 to respond to clocking signal phases to generate clocking signal phases $\Phi_{3A}$ and $\Phi_{3B}$ applied to the first shift register SR1 of FIG. 4. In FIG. 2 AND gates &7 and &8 respond to $\Phi_A$ and $\Phi_B$ clocking signal phases to supply $\Phi_{5A}$ and $\Phi_{5B}$ clocking phases to the third shift register SR3 of FIG. 4 only if the CHIP SELECT signal stored in shift register stage RS2 is a ONE as well as the fifth instruction code 101 being supplied to decoder DEC from the INSTRUCT0, INSTRUCT1 and INSTRUCT2 lines of the INSTRUCTION bus via bond pads BP9, BP10 and BP11. In FIG. 2 AND gates &9 and &10 respond to $\Phi_A$ and $\Phi_B$ clocking signal phases to supply $\Phi_{6A}$ and $\Phi_{6B}$ clocking phases to the fourth shift register SR4 of FIG. 4 only if the CHIP SELECT signal stored in shift register stage RS2 is a ONE as well as the sixth instruction code 110 being supplied to decoder DEC.

The zeroeth, extended shift register is operated so it contains only two ONEs at any time, so phased that only one of them at a time is in a shift register stage that generates a CHIP SELECT signal and the other is in a shift register stage that generates a CHIP TEST OUTPUT ENABLE signal. Accordingly, each of the third through sixth instruction codes enables selective application of clocking signals in only a selected one of the chips to which the INSTRUCTION bus connects, the one of the chips having a ONE in its shift register stage that generates the CHIP SELECT signal. The second instruction code enables selective application of clocking signals in only a selected one of the chips to which the INSTRUCTION bus connects, the one of the chips having a ONE in its shift register stage that generates a CHIP TEST OUTPUT ENABLE signal. The second through sixth instruction codes can be applied only one at a time to the INSTRUCT0, INSTRUCT1 and INSTRUCT2 lines of the INSTRUCTION bus connecting to bond pads BP9, BP10 and BP11. The second, third, fifth and sixth instruction codes accordingly provide for the time-division-multiplexed loading of the bit stream supplied via the SERIAL TEST FEED bus to bond pad BP7 into the shift registers shown in FIG. 4. Loading is done through the respective serial data input ports of the first shift register SR1, the third shift register SR3 and the fourth shift register SR4 of the chip selected by the CHIP SELECT token and into the serial data input ports of the second shift register SR2 of the chip selected by the CHIP TEST OUTPUT ENABLE token.

FIGS. 5 and 6 show representative chunks CHUNK1 and CHUNK2, respectively, of electronic circuitry on one of the chips of the electronic system and portions of the built-in test circuitry serving them. The "mini" bond pads MBP1, MBP2, MBP3 and MBP4 are associated with high density interconnections that are selectively made to the input port of CHUNK1. The "mini" bond pads MBP5, MBP8, MBP7 and MBP8 are associated with high density interconnections that are selectively made from the test output port of CHUNK1. The "mini" bond pads MBP9, MBP10, MBP11 and MBP12 are associated with high density interconnections that are selectively made to the input port of CHUNK1. The "mini" bond pads MBP13, MBP14, MBP15 and MBP16 are associated with high density interconnections that are selectively made to the input port of CHUNK1.

High-density interconnections M1, M2, M3 and M4, respectively connect together "mini" bond pad MBP5 of CHUNK1 to "mini" bond pad MBP9 of CHUNK2, "mini" bond pad MBP8 of CHUNK1 to "mini" bond pad MBP10 of CHUNK2, "mini" bond pad MBP7 of CHUNK1 to "mini" bond pad MBP11 of CHUNK2 and "mini" bond pad MBP8 of CHUNK1 to "mini" bond pad MBP12 of CHUNK2.

During normal operation of the chip, the TEST ENABLE signal is a ZERO, causing ZERO output responses from AND gates &11 of FIG. 5, &12 of FIG. 6, and so forth, which AND gates receive TEST signal. In FIG. 5 AND gate &11 output response being a ZERO conditions transmission gates TG1, TG2, TG3 and TG4 to be non-conductive and not to apply chunk input test vector (from tristate drivers TS1, TS2, TS3 and TS4 of FIG. 4) to the test input port of CHUNK1; in FIG. 6 AND gate &12 output response being a ZERO conditions gates transmission TG5, TG6, TG7 and TG8 to be non-conductive and not to apply chunk input test vector to the test input port of CHUNK2; and so forth for any other chunks of electronic circuitry on the same chip.

During normal operation of the chip, the TESTBAR signal is a ONE, causing ONE output responses from OR gates OR1 and OR2 in FIG. 5, OR3 and OR4 in FIG. 6, and so forth, which OR gates receive TESTBAR signal. OR gate OR1 response being ONE conditions transmission gates TG9, TG10, TG11 and TG12 selectively to connect the "mini" bond pads MBP1, MBP2, MBP3 and MBP4 associated with high density interconnections to the input port of CHUNK1. OR gate OR2 response being ONE conditions tristate drivers TS5, TS6, TS7 and TS8 to transmit the output responses from CHUNK1 output port at low source impedances to high-density interconnections M1, M2, M3 and M4, respectively. OR gate OR3 response being ONE conditions transmission gates TG13, TG14, TG15 and TG16 selectively to connect from high-density interconnections M1, M2, M3 and M4 to the input port of CHUNK2. OR gate OR4 response being ONE conditions tristate drivers TS9, TS10, TS11 and TS12 to transmit the output responses from CHUNK2 output port at low source impedances to the "mini" bond pads MBP13, MBP14, MBP15 and MBP16. Similar arrangements can be made for selectively completing all interchunk connections on a chip, supposing there are more than two chunks on the chip.

The beginning portion of the fourth shift register SR4 comprises successive shift stages RS3, RS4, RS5 and RS6 in FIG. 5 that hold CHUNK SELECTION signal tokens for CHUNK1 and successive shift stages RS7, RS8, RS9 and RS10 in FIG. 6 that hold CHUNK SELECTION signal tokens for CHUNK2. These shift stages (and their successors that hold CHUNK SELECTION signal tokens for the chunks up to CHUNKM, supposing the chip to have a plurality M more than two chunks of electronic circuitry) pass the electronic token signals used for chunk selection on the chip. During testing the TEST ENABLE signal is a ONE, so the responses of AND gates &11, &12 etc. are identical to the respective single-bit contents of the second stage RS4 of shift register SR4, the sixth stage RS8 of shift register SR4 and every fourth stage thereafter. The contents of these stages of the fourth shift register SR4 control, dependent upon whether each is a ONE or ZERO, respectively, whether or not the chunk input test vector is selectively applied to the input port of an associated chunk of electronic circuitry within the chip. During testing the TESTBAR signal is a ZERO, so the responses of OR gates OR1 of FIG. 5, OR3 of FIG. 6, etc. are identical to the single-bit contents of the first stage RS3 of shift register SR4, of the fifth stage RS7 of shift register SR4, and every fourth stage thereafter to control, dependent upon whether each stage content is a ONE or a ZERO respectively, whether or not the input port of an associated chunk of electronic circuitry is selectively connected to its HDI "mini" bond pad. Since TESTBAR signal is a ZERO during testing, the responses of OR gates OR2 of FIG. 5, OR4 of FIG. 6, etc. are identical to the single-bit contents of the third stage RS5 of shift register SR4, of the seventh stage RS9 of shift register SR4 and every fourth stage thereafter to control, dependent upon whether each stage content is a ONE or a ZERO, respectively, whether or not the output port of an associated chunk of electronic circuitry on the chip selectively drives its HDI "mini" bond pad.

The single-bit contents of the fourth and eighth shift stages RS6 and RS10 and of each fourth shift stage thereafter are used to select which of the chunks CHUNK1, CHUNK2 etc. of electronic circuitry on the chip can have a connection of its output port connected to the PROBE line that, as shown in FIG. 1, selectively drives the TEST OUT line via tristate driver TS0 and full-sized bond pad BP6. At any time, at most one of these fourth, eighth, etc. shift stages holds a ONE.

In FIG. 5, AND gates &13, &14, &15 and &16 receive respective input signals from the TEST RESULT BIT SELECT lines, only one of which signals is a ONE and the other of which are ZEROs. If shift stage RS6 in the fourth shift registers SR4 holds a ONE, the one of AND gates &13, &14, &15 and &16 receptive of a ONE from its TEST RESULT BIT SELECT line will have a ONE as its response; the others will respond with a ZERO. Tristate drivers TS13, TS14, TS15 and TS16 are conditioned for high- or low-source-impedance output to the PROBE line depending on whether the output responses of AND gates &13, &14, &15 and &16 respectively are ZERO or ONE. The multiplexing of output signals from all chunks of electronic circuitry on the chip, including CHUNK1 and CHUNK2, is done the same way.

In FIG. 6, for example, AND gates &17, &18, &19 and &20 receive respective input signals from the TEST RESULT BIT SELECT lines, only one of which signals is a ONE and the other of which are ZEROs. If shift stage RS10 of shift register SR4 holds a ONE, the one of AND gates &17, &18, &19 and &20 receiving that ONE as one of its input signals and a ONE from its TEST RESULT BIT SELECT line as the other of its input signals will condition the one of the tristate drivers TS17, TS18, TS19 and TS20 controlled by its ONE output response to have a low source impedance to drive the PROBE line. Each other of the tristate drivers TS13, TS14, TS15, TS16, TS17, TS18, TS19 and TS20 is controlled by a ZERO response from a respective one of AND gates &13, &14, &15, &16, &17, &18, &19 and &20 to offer a high source impedance to the PROBE line.

The order in which control signals are taken from each successive cycle of four successive stages in shift register SR4 is arbitrary, but the order shown in FIGS. 5 and 6 is one in which the chunk select signal is three successive ONEs, both for chunk testing and for high-density interconnection testing. For chunk testing CHUNK1 shift stages RS3, RS4, RS5, RS6, RS7, RS8, RS9 and RS10 have a 0111 0000 pattern in them reading from left to right. For testing the interconnections from CHUNK1 output port to CHUNK2 input port the pattern is 0001 1100. For chunk testing CHUNK2 the pattern is 0000 0111. Somewhat different patterns of ONEs and ZEROs will be noted when testing interconnections between chunks that do not receive the electronic token signals used for chunk selection on the chip from adjacent segments of the fourth shift register SR4.

Figure 7:
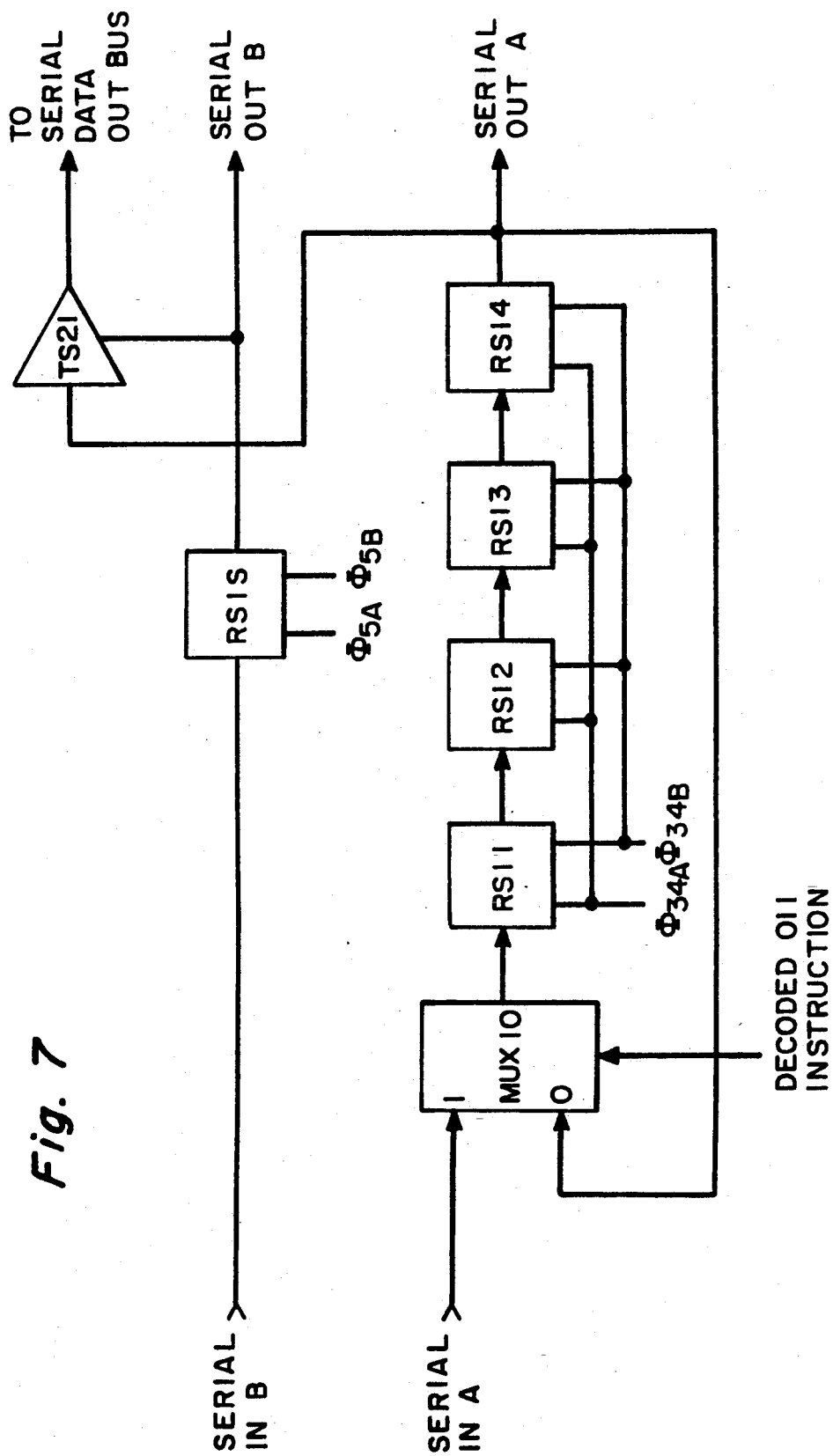
FIG. 7 is a block schematic diagram of circuitry that is repeated for each test input connection to a chunk of electronic circuitry to provide a recirculating test vector input register and associated mask register, in accordance with an aspect of the invention.

FIG. 7 shows the circuitry for applying one bit place of a set of successive input test vectors to a respective bit-connection of an input port of a chunk of electronic circuitry. The circuitry has SERIAL IN A, SERIAL IN B, SERIAL OUT A and SERIAL OUT B connections. Its SERIAL IN A connection is usually to the SERIAL OUT A connection of preceding similar circuitry in order to extend the first shift register SR1 by additional shift stages RS11, RS12, RS13, and RS14. Its SERIAL IN B connection is usually to the SERIAL OUT B connection of preceding similar circuitry, in order to extend the third shift register SR3 that stores input test vector masks by an additional shift stage RS15. The exceptions are that the initial circuits in the first shift register SR1 and in the third shift register SR3 have their SERIAL IN A and SERIAL IN B connections both to the SERIAL TEST FEED line via the seventh bond pad BP7. A tristate driver TS21 corresponds to tristate driver TS1, TS2, TS3 or TS4 of FIG. 4, for example. The presence of the third instruction on the bond pads BP9, BP10 and BP11 causes decoder DEC in FIG. 2 to apply a logic ONE as control signal to a multiplexer MUX10, to condition multiplexer MUX10 to complete SERIAL IN A connection to shift register stage RS11. This cascades the shift stages RS11, RS12, RS13 and RS14 in the FIG. 7 circuitry with similar shift stages in replicates of the FIG. 7 circuitry to form an extended shift register that is serially loaded at one end when the third instruction is present.

When the third instruction is no longer present, the ZERO applied as control signal to multiplexer MUX10 conditions multiplexer MUX10 to connect SERIAL OUT A connection to shift stage RS11 to complete a ring connection of the shift stages RS11, RS12, RS13 and RS14. The FIG. 7 circuitry and its replicates receive clocking signal when the fourth instruction code is supplied to the decoder DEC of FIG. 2 to recirculate four test input vectors. By cascading further shift stages with RS11, RS12, RS13 and RS14 before the SERIAL OUT A connection a larger number of test input vectors can be circulated; or one may eliminate one or more of these shift stages and circulate fewer test input vectors. From the standpoint of circulating a repeating alternating ZERO and ONE pattern in first shift register SR1 during the testing of interconnections between chunks, it is preferable that shift register SR1 be designed to circulate an even number of input test vectors. Where a long sequence of input test vectors is to be employed in functional testing, however, it is usually preferable to break up the sequence into a succession of shorter sequences and to perform testing piecemeal. The register SR1 is successively loaded with each shorter sequence and testing is done with that shorter sequence. Arranging to circulate more than four test input vectors in shift register SR1 tends to put more test hardware onto the chip than is desirable.

Figure 8:
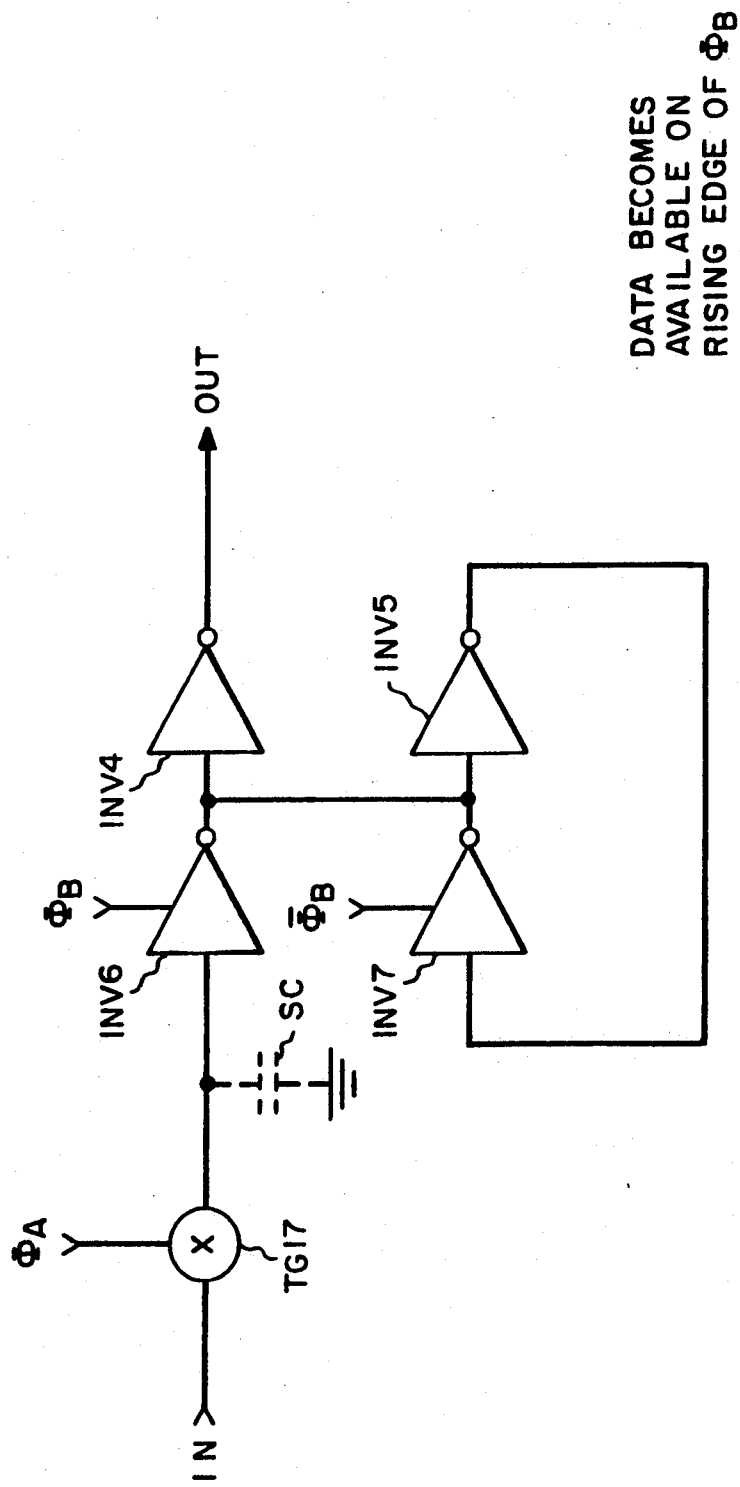
FIG. 8 is a detailed block schematic diagram of shift register stage circuitry as may be used in the circuits shown in FIGS. 2-7.

FIG. 8 shows a representative design for a shift stage such as RS1, RS2, RS3, RS4, RS5, RS6, RS7, RS8, RS9, RS10, RS11, RS12, RS13, RS14 or RS15. Non-overlapping two-phase clock signals $\Phi_A$ and $\Phi_B$ (as well as their complements, though not specifically shown) are supplied to the FIG. 8 shift stage.

Logic inverters INV4 and INV5 are each formed using a respective pair of n-channel and p-channel enhancement-mode field-effect transistors in common-source amplifier configuration, with interconnected gate electrodes as input connection, and with interconnected drain electrodes as output connection. Clocked logic inverters INV6 and INV7 differ in structure from logic inverter INV4 and INV5 in that in each of the clocked inverters the common-source-amplifier n-channel enhancement-mode field-effect transistor has interposed in its drain connection an additional n-channel enhancement-mode field-effect transistor receiving $\Phi_B$ clock signal at its gate electrode and in that in each of the clocked inverters the common-source-amplifier p-channel enhancement-mode field-effect transistor has interposed in its drain connection an additional p-channel enhancement-mode field-effect transistor receiving the complement of $\Phi_B$ clock signal at its gate electrode.

A transmission gate TG17, as may comprise the paralleled channels of an n-channel enhancement-mode field-effect transistor receiving $\Phi_A$ clock signal at its gate electrode and a p-channel enhancement-mode field-effect transistor receiving the complement of $\Phi_A$ clock signal at its gate electrode, responds to $\Phi_A$ clock signal being a ONE to impress the logic state at the shift stage input terminal IN on the capacitance SC to surroundings of the input connection of the clocked inverter INV6. Subsequently, when $\Phi_B$ clock signal is ONE, clocked logic inverter INV6 applies the complement of the logic condition at its input connection to the input connection of logic inverter INV4. Logic inverter INV4 responds to apply the same logic condition as was on capacitance SC to the shift stage output terminal OUT. Clocked logic inverter INV6 also applies the complement of the logic condition at its input connection to the input connection of logic inverter INV5, and logic inverter INV5 responds to apply the same logic condition as was on capacitance SC to the input connection of clocked logic inverter INV7 with sufficient delay that, when $\Phi_B$ clock signal subsequently returns to ZERO and its complement goes to ONE, clocked logic inverter INV7 maintains the complement of the logic condition at its input connection to the input connection of logic inverter INV4 to preserve the same logic condition as was on capacitance SC at the shift stage output terminal OUT until the next time that $\Phi_B$ clock signal goes to ONE.

Consider the procedure for testing the individual chips during wafer probing to determine whether or not they meet functional requirements. This procedure entails steps 1 through 9 listed immediately below, best understood by reference to FIGS. 2-6.

(1) The chip is enabled for testing. This is done by applying a ONE as CHIP SELECT IN signal to bond pad BP4, and a 001 first instruction code to bond pads BP9, BP10 and BP11. Thereafter the TEST CLOCK signal applied to bond pad BP8 is cycled twice, stopping when $\Phi_B$ is high, to clock a ONE as CHIP TEST OUTPUT ENABLE signal being true int shift stage RS2 and to clock a ONE as CHIP SELECT signal being true into shift stage RS1. ONEs are applied to both inputs of AND gate &0 enabling tristate driver TS0 to drive bond pad BP6 from a low source impedance, then, providing that a ONE is applied as TEST ENABLE signal to bond pad BP3.

(2) A succession of test vectors are loaded in bit serial form into the first shift register SR1. This is done by applying a 011 third instruction code to bond pads BP9, BP10 and BP11 and cycling the TEST CLOCK signal applied to bond pad BP8 once for each bit in each of the successive test vectors supplied as SERIAL TEST FEED to bond pad BP7.

(3) Enable the application of all bits of each successive test vector to input ports to be selected. This is done by simultaneously applying a ONE as SERIAL TEST FEED to bond pad BP7 and applying a 101 fifth instruction code to bond pads BP9, BP10 and by BP11 and cycling the TEST CLOCK signal applied to bond pad BP8 once for each bit in an input test vector.

(4) Select CHUNKN for testing. $N^{th}$ is the ordinal number of the chunk to be tested as determined by the progression through the quads of shift stages in shift register SR4, there being first through $P^{th}$ chunks on the chip. A 110 sixth instruction code is applied to bond pads BP9, BP10 and BP11. The TEST CLOCK signal applied to bond pad BP8 is cycled through 4P cycles beginning with and ending with $\Phi_B$.

In regard to the nature of the SERIAL TEST FEED signal during this step, a ZERO is applied to bond pad 7 for each cycle except the $(4P-4N+1)^{th}$ through $(4P-4N+3)^{th}$ cycles, when a ONE is applied. This connects only CHUNKN input port to receive input test vectors from the first shift register SR1 and conditionally applies each bit of CHUNKN output port to bond pad BP6 via the PROBE line and tristate driver TS0. All other chunks have their input ports grounded and isolated from the first shift register SR1 and have their output tristate drivers disabled.

(5) Select one output bit of CHUNKN to observe. A 010 second instruction code is applied to bond pads BP9, BP10 and BP11, and the desired output bit address is serially shifted into shift register SR2. The TEST ENABLE signal is placed in a true or ONE condition.

(6) Maintain the TEST ENABLE signal in a true or ONE condition, circulate the input test vector(s) stored in shift register SR1, and observe the TEST OUT signal from bond pad BP6. This is done by applying a 100 fourth instruction code to bond pads BP9, BP10 and BP11 and cycling TEST CLOCK signal for as many cycles as there are successive test vectors stored in shift register SR1.

(7) Repeat steps (5) and (6) once for each other output bit of CHUNKN. The output vector results from each input test vector can now be constructed.

(8) Repeat step (4) to select another chunk that requires the same input test vector sequence as first used, if possible. This may not require complete reloading of the fourth shift register SR4, but merely a forward shift while loading ZEROs into the shift register via bond pad BP7 as SERIAL TEST FEED. Repeat steps (5), (6) and (7) to test the newly selected chunk with the stored input test vectors.

(9) Repeat steps (2) through (8) until enough sets of test vectors have been sent through all chunks to completely functionally test all of the circuitry on the chip.

The foregoing procedure may be modified to test the functionality of chunks of electronic circuitry in an electronics system using a plurality of the monolithic integrated circuits with built-in test circuitry of the nature described in the preceding portion of this specification. Step (1) of the procedure is modified to cycle the TEST CLOCK signal that multiple of two times as will select the monolithic integrated circuit chip to be enabled for testing.

Consider the procedure for testing the high-density interconnections among a number L of monolithic chips mounted on a common substrate. In considering such a procedure the "input" and "output" ends of the HDI wires will be assigned according to the direction of data flow during normal operation; during interconnection testing the HDI wires are driven at their "output" ends, and responses are sensed from their "input" ends. A procedure that entails steps 10-27 set forth immediately below tests interconnections among a number L of monolithic chips mounted on a common substrate and is made possible by the first shift register SR1 storing an even number of test vectors therein.

(10) Enable for test all L chips on the substrate. Respective bits of a 001 first instruction code are applied into the INSTRUCT0 line connecting the BP9 bond pads, the INSTRUCT1 line connecting the BP10 bond pads and the INSTRUCT2 line connecting the BP11 bond pads. At the same time 2L bits aternating ZEROs and ONEs are serially clocked into the zeroeth, extended shift register by alternately applying ZERO and ONE to its initial stage while the TEST CLOCK signal applied to the paralleled BP8 bond pads of the chips is cycled 2L times. At the end of this step each of the L chips on the substrate has a ONE stored as CHIP SELECT bit in its RS1 shift register stage and has a ZERO stored as CHIP TEST OUTPUT bit in its RS2 shift register stage.

(11) A 011 third instruction code is applied to the INSTRUCT0, INSTRUCT1 and INSTRUCT2 lines of the INSTRUCTION bus. At the same time a pK-bit long vector of alternating ONEs and ZEROs is serially loaded, parallelly, into the SR1 first shift registers of the chips, where K is the maximum number of bits in the input test vectors of any of the L chips on the substrate, where p is the number of test vectors stored in the circulating test vector register SR1, and where pK is p times K.

(12) Maintain a TEST ENABLE signal that is true, or ONE, throughout at least the remaining steps of this testing procedure.

(13) Disconnect all the input and output minipads from the chunk circuitry, as follows. Apply a 110 sixth instruction code to the three-wire bus connecting BP9 bond pads, connecting BP10 bond pads and connecting BP11 bond pads. At the same time apply a ZERO to the paralleled BP7 bond pads of the L chips, and cycle the TEST CLOCK signal applied to the paralleled BP8 bond pads of the L chips a sufficient number of times to load all ZEROs into the SR4 fourth shift registers of all L chips.

(14) For each HDI wire to be tested, assume one output connection from a chunk and one input connection to another chunk are supposed to be connected. Determine if these chunks are on the same chip or are on different chips. If these chunks are on the same chip, do not perform steps (15)-(19), but rather skip to successive steps (20) and (21). Step (20) selects the chip containing the chunks connected by the HDI wire being tested; and step (21) selects the chunks connected by the HDI wire being tested. If the chunks connected by the HDI wire being tested are on different chips, perform steps (15)-(19) and then skip over steps (20) and (21) to step (22). Step (16) selects the chunk having its output connection to the input end of the HDI wire being tested after step (15) selects the chip containing that chunk. Step (18) selects the chunk having its input connection from the output end of the HDI wire being tested after step (17) selects the chip containing that chunk. Step (19) thereafter simultaneously enables for test the two chips containing the chunks connected by the HDI wire being tested for the remaining steps in the HDI testing procedure.

(15) A 001 first instruction code is applied to the INSTRUCT0, INSTRUCT1 and INSTRUCT2 lines of the INSTRUCTION bus. At the same time the TEST CLOCK signal is cycled 2L times to serially load into the zeroeth, extended shift register a signal that is all ZEROs except for a single ONE that is shifted to the position in the zeroeth, extended shift register for generating a CHIP SELECT signal corresponding to the chip providing the output connection to the input end of the HDI wire being tested.

(16) Enable the application of a selected test result bit to the PROBE line from the chunk providing the output connection to the input end of the HDI wire being tested. The 110 sixth instruction code is applied as INSTRUCTION signal to the INSTRUCT0, INSTRUCT1 and INSTRUCT2 lines respectively connecting BP9 bond pads, connecting BP10 bond pads and connecting BP11 bond pads. The SERIAL TEST FEED signal, which is serially shifted into the SR4 shift register of the chip selected in step (15) as the TEST CLOCK signal is cycled, is all ZEROs except for a single ONE, which ONE after cycling of the TEST CLOCK signal concludes is in the shift stage of that SR4 shift register that respectively conditions the selective application to the PROBE line of one of the bits of the chunk output connection to the input end of the HDI wire being tested. Since TEST ENABLE signal is true, or ONE, the bit selectively applied to the PROBE line is applied with low source impedance to the paralleled BP6 bond pads by the TS0 tristate of the chip selected per step (15).

(17) A 001 first instruction code is applied to the INSTRUCT0, INSTRUCT1 and INSTRUCT2 lines of the INSTRUCTION signal. At the same time the TEST CLOCK signal is cycled 2L times to serially load into the zeroeth, extended shift register a signal that is all ZEROs except for a single ONE, which ONE after cycling of the TEST CLOCK signal concludes is in the shift stage of that SR4 shift register that respectively conditions the generation of a CHIP SELECT signal corresponding to the chip providing the input connection from the output end of the HDI wire being tested.

(18) Make the initial arrangement for connecting the output end of the HDI wire under test from the SR1 first shift register circulating input test vectors. This is done by applying the 110 sixth instruction code as INSTRUCTION signal to the INSTRUCT0, INSTRUCT1 and INSTRUCT2 lines respectively connecting BP9 bond pads, connecting BP10 bond pads and connecting BP11 bond pads. The SERIAL TEST FEED signal, which is serially shifted into the SR4 shift register of the chip selected in step (17) as the TEST CLOCK signal is cycled, is all ZEROs except for two ONEs which after cycling of the TEST CLOCK signal concludes are in the shift stages of that SR4 shift register that respectively conditions the selective connection of the output end of the HDI wire to the succeeding chunk input port and conditions the selective connection of the SR1 first shift register circulating input test vectors to that succeeding input port.

(19) Enable for test the two chips containing the chunks connected by the HDI wire being tested. A 001 first instruction code is applied to the INSTRUCT0, INSTRUCT1 and INSTRUCT2 lines of the INSTRUCTION bus. At the same time the TEST CLOCK signal is cycled 2L times to serially load into the zeroeth, extended shift register a signal that is all ZEROs except for two ONEs. One of these ONEs is shifted to the position in the zeroeth, extended shift register for generating a CHIP SELECT signal corresponding to the chip having an input connection from the output end of the HDI wire being tested. The other of these ONEs is shifted to the position in the zeroeth, extended shift register for generating a CHIP TEST OUTPUT ENABLE signal corresponding to the chip providing the output connection to the input end of the HDI wire being tested. Skip to step (22).

(20) Enable for test the single chip containing the chunks connected by the HDI wire being tested. A 001 first instruction code is applied to the INSTRUCT0, INSTRUCT1 and INSTRUCT2 lines of the INSTRUCTION bus. At the same time the TEST CLOCK signal is cycled 2L times to serially load into the zeroeth, extended shift register a signal that is all ZEROs except for two ONEs. These ONEs are shifted to the positions in the zeroeth, extended shift register for generating CHIP SELECT and CHIP TEST OUTPUT ENABLE signals for the chip being enabled for testing.

(21) Make the initial arrangement for connecting the output end of the HDI wire under test from the SR1 first shift register circulating input test vectors and for connecting the input end of the HDI wire under test to the PROBE line of the chip enabled for testing. This is done by applying the 110 sixth instruction code as INSTRUCTION signal to the INSTRUCT0, INSTRUCT1 and INSTRUCT2 lines respectively connecting BP9 bond pads, connecting BP10 bond pads and connecting BP11 bond pads. The SERIAL TEST FEED signal, which is serially shifted into the SR4 shift register of the chip selected in step (20) as the TEST CLOCK signal is cycled, is all ZEROs except for three ONEs which after cycling of the TEST CLOCK signal concludes are in the shift stages of that SR4 shift register that respectively conditions the selective connection of the output end of the HDI wire to the succeeding chunk input port, conditions the selective connection of the SR1 first shift register circulating input test vectors to that succeeding input port, and conditions the selective application to the PROBE line of one of the bits of the chunk output connection to the input end of the HDI wier being tested. Since TEST ENABLE signal is true, or ONE, the bit selectively applied to the PROBE line is applied with low source impedance to the paralleled BP6 bond pads by the TS0 tristate of the chip selected per step (20).

(22) Specify the bit position of the single-bit connection of the selected input port to which the HDI wire being tested connects, thereby completing arrangements for connection of the output end of the HDI wire under test from the SR1 first shift register circulating input test vectors. The INSTRUCTION signal is a 101 fifth instruction code enabling the serial loading of K bits into the SR3 shift register of the chip previously selected by the CHIP TEST OUTPUT ENABLE signal in step (19) or (20), as the TEST CLOCK signal applied in parallel to the BP8 bond pads is cycled. All of the loaded bits are ZEROs except the one which corresponds to the output end of the HDI wire selected for testing, which bit is ONE.

(23) Specify the bit position in the single-bit connection of the selected output port from which the HDI wire being tested connects, thereby completing arrangements for connection of the input end of the HDI wire under test to paralleled bond pads BP6. The INSTRUCTION signal is the 010 second instruction code. The address of the single-bit connection is the SERIAL TEST FEED supplied in parallel to the BP7 pads, which is shifted into the SR2 test results mask register of the chip previously selected in step (19) or (20), as the TEST CLOCK signal applied in parallel to the BP8 bond pads is cycled.

(24) Apply the 100 fourth instruction code as INSTRUCTION signal and cycle the TEST CLOCK signal. If the paralleled BP6 bond pads alternate between ZERO and ONE, then the HDI wire under test is conductive.

(25) Repeat steps (22)-(24) for all bit positions of the connections between the two selected chunks.

(26) If it is desired to assure that no shorts exist between a pair HDI wires, repeat steps (22)-(25) specifying the bit position of one in step (22) and the bit position of the other in step (23). If the paralleled BP6 bond pads alternate between ZERO and ONE, then a short-circuit between the pair of HDI wires exists.

(27) Repeat steps (14)-(25) or steps (14)-(26) for all port-to-port connections.

The theory behind the foregoing test procedure is this. The testing of HDI wires is done by passing test signals through them in the direction opposite to that in which signals are passed during normal operation. The CHUNK INPUT TEST VECTOR bus in a selected chip has one low-impedance line cycling between ONE and ZERO which is selectively applied to one "mini" bond pad of one bit position in the input port of one chunk. This "mini" bond pad is selectively connected to the output end of the HDI wire under test, so the signal cycling between ONE and ZERO selectively appears at the end of the wire. If the HDI wire is conductive, the signal cycling between ONE and ZERO appears at its input end, which selectively drives the PROBE line in the selected chip. The TS0 tristate driver in the selected chip drives the TEST OUT line of the substrate which links the BP6 bond pads of the chips on that substrate. Absence of the signal cycling between ONE and ZERO indicates lack of conduction in the HDI wire being tested.

Figure 9:
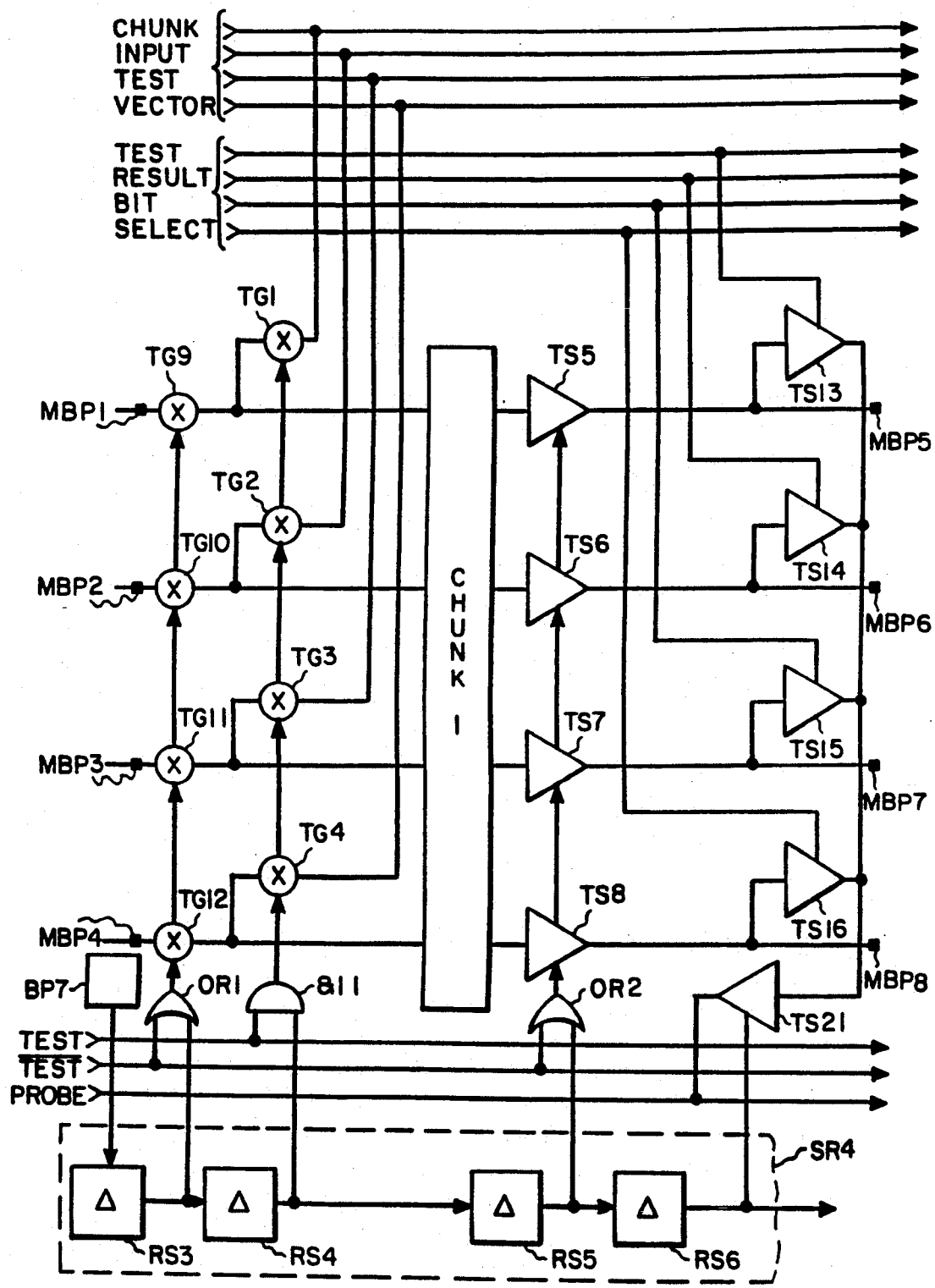
FIG. 9 is a block schematic of a type of modification that can be made in the circuitry of FIGS. 5 and 6 to provide an alternative type of built-in test circuitry embodying an aspect of the invention.

FIG. 9 shows a modification tending to reduce capacitive loading of the PROBE line. Such modification can be made to the circuitry of FIG. 5, with similar modifications being made to the circuitry of FIG. 6 etc. Rather than the PROBE line being driven by as many tristate drivers as there are bits in the output ports of all the chunks, then, the PROBE line is driven by only as many tristate drivers TS21, TS22, etc. as there are corresponding chunks. Each of these tristate drivers (TS21, in the FIG. 9 circuitry) is driven from the output connections of the group of tristate drivers (TS13, TS14, TS15, TS16 in the FIG. 9 circuitry) associated with respective bit positions in the output port of the corresponding chunk. Each of the tristate drivers in such a group receives a respective one of the TEST RESULT BIT SELECT bits directly, rather than selectively via a respective AND gate, and needs only to have the capability to drive the subsequent tristate driver to PROBE line. AND gates &13, &14, &15 and &16 are dispensed with. The subsequent tristate driver TS21 to the PROBE line performs the ANDing function instead. The subsequent tristate drivers TS21, TS22, etc. to the PROBE line encounter only about a quarter as much capacitance on the PROBE line of FIG. 9 as is on the PROBE line of FIG. 5. This is because a single tristate driver per chunk output port connects to the PROBE LINE rather than respective tristate drivers for each of the bit connections from the chunk test output port. So the drive capability required of tristate driver TS21 in FIG. 9 is only about a quarter of the combined drive capabilities required of TS13, TS14, TS15, and TS16 in FIG. 5.

Figure 10:
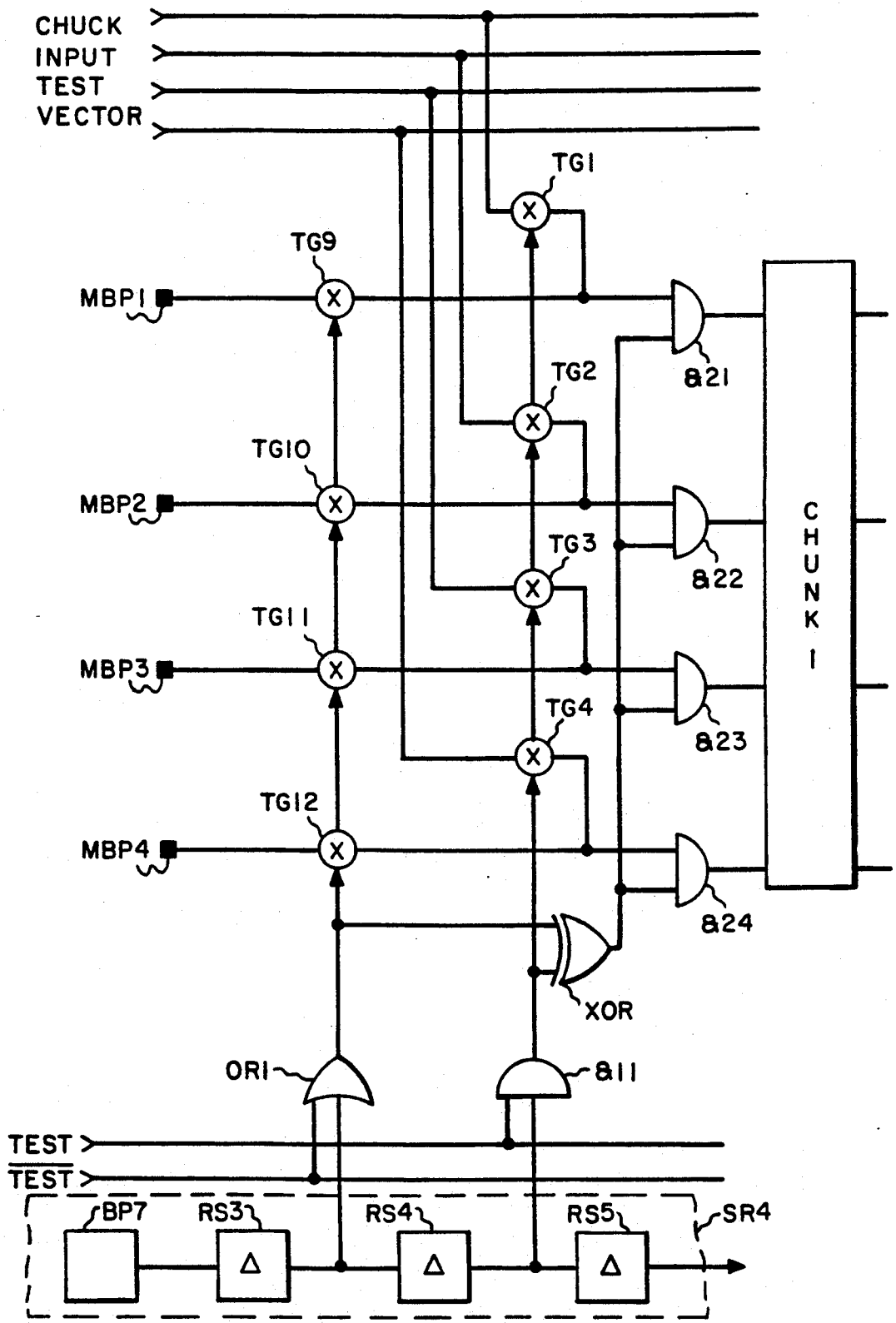
FIG. 10 is a schematic diagram illustrating how the input connections to a chunk of electronic circuitry are pulled down to logic ZERO state when they are isolated during testing.

FIG. 10 illustrates how the input connections to a chunk of electronic circuitry can be pulled down to logic ZERO state when they are isolated during testing. The CHUNK1 input connections are selectively pulled down to logic ZERO state by AND gates &21, &22, &23 and &24 respectively responsive to the output of an exclusive-OR gate XOR being low—i.e., at logic ZERO. This occurs when both &11 and OR1 gates have ZERO output responses conditioning all the transmission gates TG1, TG2, TG3, TG4, TG9, TG10, TG11 and TG12 to be non-conductive. The non-conduction of these transmission gates would isolate the input connections of CHUNK1 and leave their potentials uncertain, if the AND gates &21, &22, &23 and &24 were not used to provide selective clamping of these input connections. The output of exclusive-OR gate XOR is also ZERO during HDI testing when both &11 and OR1 gates have ONE output responses conditioning all the transmission gates TG1, TG2, TG3, TG4, TG9, TG10, TG11 and TG12 to be conductive. This confines the application of the test vectors to the high-density interconnections. When exclusive-OR gate XOR output is high—i.e., at logic ONE—the output signals of AND gates &21, &22, &23 and &24 have the same logic states as their input signals applied via "mini" bond pads MBP1, MBP2, MBP3 and MBP4 or from test vector register SR1 respectively have.

The built-in test circuitry thus far described can be modified to write an optimally efficient binary code into the second shift register SR2 to indicate which bit of a selected test output is to be applied to the PROBE line, rather than using a positional code. However, a decoder is needed for responding to the efficient binary code to control the application of the selected bit to the PROBE line.

The simple positional code stored in each successive group of four stages (IRS3, RS4, RS5, RS6; RS7, RS8, RS9, RS10; etc ) in the fourth shift register SR4 is not optimally efficient for doing just isolated chunk testing and interconnection testing. The number of stages in fourth shift register SR4 can be reduced by coding the chunk selection information using a more sophisticated chunk selection code stored in successive groups of only three or only two stages, but this reduces flexibility in the testing procedures. Troubleshooting tests over a plurality of chunks are not so readily implemented.

Token passing can be used to address the test input ports and test output ports of the built-in test circuitry of each monolithic integrated circuit in just a chunk-selection dimension, rather than in both chip-selection and chunk-selection dimensions as thus far described. This can be done by loading the fourth shift register from the SELECT IN line via bond pad BP4, rather than from the SERIAL TEST FEED line via bond pad BP7. Shift register stages RS1 and RS2 are dispensed with, and buffer amplifier BA1 receives its input signal from a latter one of the shift register stages in the fourth shift register SR4. The CHIP SELECT signal is generated by ORing CHUNK SELECT signals taken from positions along the fourth shift register SR4 (e.g., from the output ports of shift stages RS4, RS8, etc.) The CHIP TEST OUTPUT ENABLE signal is generated by ORing CHUNK TEST OUTPUT ENABLE signals taken from positions along the fourth shift register SR4 (e.g., the output ports of shifter stages RS6, RS10, etc.). A small penalty in terms of increased digital hardware and longer time to access a particular set of test parts tends to be incurred when this is done.

One skilled in the art and acquainted with the foregoing disclosure will be enabled to design other variants of the embodiments of the invention thus far described and this should be borne in mind when construing the scope of the claims which follow.

What is claimed is:

1. A monolithic integrated circuit including circuitry to be tested and internal test circuitry; said internal test circuitry having connections from a serial test feed line, to a serial test output line, from a test clock line and from instruction lines; said internal test circuitry comprising:
   means for receiving, storing and passing a first token;
   means for receiving, storing and passing a second token;
   a first shift register, having a respective serial data input port connecting from said serial test feed line, having a respective parallel data output port and having a respective clock signal input port;
   means for selecting clock signal from said test clock line for application to the clock signal input port of said first shift register, said selecting being done responsive to there being received via said instruction lines an instruction to shift the contents of said first shift register concurrently with said first token being stored in said means for receiving, storing and passing said first token of the same said monolithic integrated circuit;
   means for selecting signal from the parallel data output port of said first shift register during testing to a test input port of the circuitry to be tested;
   a second shift register having a respective serial data input port connecting from said serial test feed line, having a respective parallel data output port and having a respective clock signal input port;
   means for selecting clock signal from said test clock line for application to the clock signal input line of said second shift register, said selecting being done responsive to there being received via said instruction lines an instruction to shift the contents of said second shift register concurrently with said second token being stored in said means for receiving, storing and passing said second token of the same said monolithic integrated circuit; and
   means for selecting to said serial test output line a bit from a specified test output port of the circuitry to be tested, as controlled by parallel data from the parallel data output port of said second shift register.

2. A monolithic integrated circuit as set forth in claim 1 wherein said first shift register is of a type for storing a plurality of input test vectors that can be circulated to appear one at a time at the parallel data output port of said first shift register, said first shift register being adapted to respond to a first instruction being received via said instruction lines to shift the contents of said first shift register while connecting a plurality of shifter stages therein all in a continuous cascade connection, and said first shift register being adapted to respond to a second instruction being received via said instruction lines to shift the contents of said first shift register while connecting aliquot portions of the plurality of shifter stages therein in respective loop connections, a point in each loop connection being connected for supplying a respective bit from its said parallel data output port.

3. A monolithic integrated circuit as set forth in claim 1 wherein said internal test circuitry includes, within said means for selecting signal from the parallel data output port of said first shift register during testing to a test input port of the circuitry to be tested:
   a third shift register, having a respective serial data input port connecting from said serial test feed line, having a respective parallel data output port with a corresponding bit for each bit of the parallel data output port of said first shift register, and having a respective clock signal port;
   means for selecting clock signal from said test clock line for application to the clock signal input port of said third shift register said selecting being done responsive to there being received via said instruction lines an instruction to shift the contents of said third shift register concurrently with said first token being stored in said means for receiving, storing and passing said first token of the same said monolithic integrated circuit; and
   means for selecting bits of the parallel data output port of said first shift register for application to a specified test input port of the circuitry to be tested dependent upon the values of the corresponding bit from the parallel data output port of said third shift register.

4. A monolithic integrated circuit as set forth in claim 3 including:
   a fourth shift register, having a respective serial data input port connecting from said serial input data port, having a respective parallel data output port, and having a respective clock signal input port, a signal appearing at its parallel data output port specifying which of a plurality of test input ports to the circuitry to be tested said means for selecting bits of the parallel data output port of said first shift register is to apply those bits to, and the signal appearing at its parallel data output port further specifying which of a plurality of test output ports from the circuitry to be tested said means for selecting to said serial test output line selects from; and
   means for selecting clock signal from said test clock line for application to the clock signal input port of said fourth shift register, said selecting being done responsive to there being received via said instruction lines an instruction to shift the contents of said fourth shift register concurrently with said first token being stored in said means for receiving, storing and passing said first token of the same monolithic integrated circuit.

5. A plurality of monolithic integrated circuits as set forth in claim 4 wherein said means for receiving, storing and passing a first token and said means for receiving, storing and passing a second token of each monolithic integrated circuit are respective shift stages of a zeroeth shift register, wherein these respective shift stages are connected in cascade between a respective select input port and a respective select output port of the monolithic integrated circuit in which those respective shift stages are; and wherein each monolithic integrated circuit includes:

means for selecting clock signal from said test clock line to clock the stages of said zeroeth shift register included within that monolithic integrated circuit responsive to an instruction to shift the contents of said zeroeth shift register being received via said instruction lines.

6. A plurality of monolithic integrated circuits as set forth in claim 1 identified by consecutive ordinal numbers beginning with first and ending with a highest ordinal number, said monolithic integrated circuits being connected in combination by:

means for initially supplying said first token to the means for receiving, storing and passing a first token in said first monolithic integrated circuit;

a respective connection for passing said first token from the means for receiving, storing and passing a first token of each said monolithic integrated circuit except the one identified by the highest ordinal number to the means for receiving, storing and passing a first token in said monolithic integrated circuit identified by the next higher ordinal number;

means for initially supplying said second token to the means for receiving, storing and passing a second token in said first monolithic integrated circuit; and a respective connection for passing said second token from the means for receiving, storing and passing a second token of each said monolithic integrated circuit except the one identified by the highest ordinal number to the means for receiving, storing and passing a second token in said monolithic integrated circuit with next higher ordinal number.

7. An integrated circuit with built-in test circuitry, said integrated circuit comprising:

eleven bond pads identified by consecutive ordinal numbers first through eleventh, which first through eleventh bond pads are each of sufficient size to permit probe testing thereof, said first and second bond pads for receiving relatively negative and relatively positive operating supply voltages, said third bond pad for receiving a test enable signal that assumes a first during during testing and a second state during normal operation, said fourth bond pad for receiving a chip-select signal, said fifth bond pad for supplying a delayed chip-select signal, said sixth bond pad for supplying test output results one bit at a time, said seventh bond pad for receiving serial test feed, said eighth bond pad for receiving a test clock signal, and said ninth, tenth and eleventh bond pads for receiving respective bits of a three-bit instruction code;

chunks of electronic circuitry available for testing, each having a respective test input port and a respective test output port, each of said ports having at least one respective bit connection therein, each of said electronic circuitry chunks having no more than M bit connections in its test input port and no more than N bit connections in its test output port, each of said electronic circuitry chunks and its associated circuitry as hereinafter specified having respective first through fourth chunk selection signals associated therewith as specified hereinafter, which chunk selection signals can each assume a first logic state or a second logic state complementary to the first;

further bond pads, each corresponding to a respective one of the bit connections in the ports of said electronic circuitry chunks;

interconnections between certain of said further bond pads;

a test vector port internal to said chip having a plurality of bit connections M in number therein;

a chip test result bus;

a respective number of gates associated with each of said electronic circuitry chunks by being connected respectively for selectively applying the bit conditions at the bit connections of the test input port of that said chunk to the corresponding further bond pad, which selective applying is done only responsive to the first chunk selection signal of said chunk being in a first logic state or to said test enable signal being in a second logic state;

a respective number of further gates associated with each of said electronic circuitry chunks by being connected respectively for selectively applying to the bit connections of the test input port of that said chunk the bit condition at a respective connection of the test vector port, which selective applying is done only responsive to the second chunk selection signal of that said chunk and said test enable signal concurrently being in a first logic state;

a respective number of tristate drivers associated with each of said electronic circuitry chunks by being connected respectively for selectively applying the bit conditions at the bit connections of the test output port of that said chunk to the corresponding further bond pad, which selective applying is done only responsive to the third chunk selection signal of that said chunk being in its first logic state or to said test enable signal being in its second logic state;

a respective further number of tristate drivers identified by consecutive ordinal numbers beginning at first, associated respectively with each of said electronic circuitry chunks by being connected respectively for selectively applying to said chip test result bus the bit conditions at the further bond pads corresponding to the bit connections of each test output port of that said chunk, which selective applying is done only responsive to the fourth chunk selection signal of that said chunk and to a further control signal identified by the same ordinal number as the tristate driver concurrently being in a first logic state;

means responding to said test clock signal received at said eighth bond pad for generating a shigt register clocking signal;

a segment of a zeroeth shift register having a serial data input port connected from said fourth bond pad, having a serial data output port connected to said fifth bond pad, having a clocking signal input port, and having first and second shift register stages in cascade connection between its serial data input port and serial data output port, the signal stored in its first shifter stage being a chip selection signal in a first logic state thereof and a chip deselection signal in a second logic state thereof, the signal stored in its second shifter stage being a chip output enable signal in a first logic state thereof and a chip output disable signal in a second logic state thereof;

means responding to a first instruction code being applied to said ninth, tenth and eleventh bond pads for selectively applying said shift register clocking signal in its entirety to the clocking signal input port of said segment of a zeroeth shift register;

another tristate driver for selectively applying the bit condition on said chip test result bus to said sixth bond pad, which selective applying is done only responsive to said test enable signal being its first logic state simultaneously with said chip output enable signal being abailable;

a first shift register having a serial data input port connected from said seventh bond pad, having a clocking signal input port, having a parallel data output port with M bit connections therein respectively identified by consecutive ordinal numbers first through $M^{th}$, having a multiple of M shift register stages therein respectively identified by consecutive ordinal numbers beginning with first, having means responsive to a third instruction code being applied to said ninth and tenth and eleventh bond pads for cascading after said serial data input port its shift register stages in order of their ordinal numbering, and having means for otherwise cascading each set of its shift register stages having the same ordinal number modulo M in a respective ring including the connection of its parallel data output port identified by the same ordinal number modulo M;

means responsive to either said third or said fourth instruction code appearing on said ninth, tenth and eleventh bond pads simultaneously with said chip selection signal being available, for applying said shift register clocking signal to the clocking signal input port of said first shift register;

a second shift register having a serial data input port connected from said seventh bond pad, having a clocking signal input port and having a plurality of shift register stages N in number in cascade connection after its serial data input port, which shift register stages are identified by respective ones of consecutive ordinal numbers first through $N^{th}$ according to the order of their cascade connection, the signal stored in each of which shift register stages being said further control signal identified by the same ordinal number that shifter stage is;

means responding to said chip output enable signal being available simultaneously with a second instruction code being applied to said ninth, tenth and eleventh bond pads, for selectively applying said shift register clocking signal in its entirety to the clocking signal input port of said second shift register;

a third shift register having a serial data input port connected from said seventh bond pad, having a clocking signal input port and having a plurality of shift register stages M in number in cascade connection after its serial input port, which shift register stages are identified by respective ones of consecutive ordinal numbers first through $M^{th}$ assigned according to their order of their cascade connection;

means responding to said chip selection signal being available simultaneously with a fifth instruction code being applied to said ninth, tenth and eleventh bond pads, for selectively applying said shift register clocking signal in its entirety to the clocking signal input port of said third shift register;

a number M of still other tristate drivers for selectively connecting each connection in the parallel data output port of said first shift register to a respective one of the connections of said test vector port, responsive to the signal stored in a corresponding one of the first through $M^{th}$ stages of said third register being in a first logic state;

means for applying a prescribed bit value to each of the connections of any said test input port absent any selective connection thereto from said first shift register;

a fourth shift register having a serial data input port connected from said seventh bond pad, having a clocking signal input port, and having within a cascade connection of shift register stages after its serial data input port a respective succession of fourth shift register stages corresponding to each electronics circuitry chunk, the shift register stages in each succession being identified by consecutive ordinal numbers first through fourth assigned in order of their succession, the chunk selection signals for each said electronics circuitry chunk being supplied from different ones of the corresponding succession of shifter stages in said fourth shift register, similarly numbered chunk selection signals for said electronics circuitry chunks being thus supplied all from shift register stages in said fourth shift register that are identified by the same ordinal number; and means responding to said chip selection signal being available simultaneously with a sixth instruction code being applied to said ninth, tenth and eleventh bond pads, for selectively applying said shift register clocking signal in its entirety to the clocking signal input port of said fourth shift register.

8. An integrated circuit as set forth in claim 7 wherein the first and second shift register stages in said segment of a zeroeth shift register are its initial and final shift register stages, respectively.

9. An integrated circuit as set forth in claim 7 wherein said first, second, third and fourth shift stages in each said succession of shift stages in said fourth shift register respectively supply the first, second, third and fourth chunk selection signals to the corresponding electronics circuitry chunk.

10. An integrated circuit as set forth in claim 7 that is a monolithic chip.

11. A plurality of integrated circuits as set forth in claim 10 included in an electronics system that can be tested using the built-in test circuitry of said integrated circuits and that further includes:

a connection together of the third bond pads of said chips;

connections to the fourth bond pads of said chips and from the fifth bond pads of ones of said chips for connecting the segments of said zeroeth shift registers of said chips together to form said zeroeth shift register;

a connection together of the sixth bond pads of said chips;

a connection together of the seventh bond pads of said chips;

a connection together of the eighth bond pads of said chips;

a connection together of the ninth bond pads of said chips;

a connection together of the tenth bond pads of said chips; and a connection together of the eleventh bond pads of said chips.

12. An integrated circuit with built-in test circuitry, said integrated circuit comprising:

eleven bond pads identified by consecutive ordinal numbers first through eleventh, which first through eleventh bond pads are each of sufficient size to permit probe testing thereof, said first and second bond pads for receiving relatively negative and relatively positive operating supply voltages, said third bond pad for receiving a test enable signal that assumes a first state during testing and a second state during normal operation, said fourth bond pad for receiving a chip-select signal, said fifth bond pad for supplying a delayed chip-select signal, said sixth bond pad for supplying test output results one bit at a time, said seventh bond pad for receiving serial test feed, said eighth bond pad for receiving a test clock signal, and said ninth, tenth and eleventh bond pads for receiving respective bits of a three-bit instruction code;

chunks of electronic circuitry available for testing, each having a respective test input port and a respective test output port, each of said ports having at least one respective bit connection therein, each of said electronic circuitry chunks having no more than M bit connections in its test input port and no more than N bit connections in its test output port, each of said electronic circuitry chunks and its associated circuitry as hereinafter specified having respective first through fourth chunk selection signals associated therewith as specified hereinafter, which chunk selection signals can each assume a first logic state or a second logic state complementary to the first;

further bond pads, each corresponding to a respective one of the bit connections in the ports of said electronic circuitry chunks;

interconnections between certain of said further bond pads;

a test vector port internal to said chip having a plurality of bit connections M in number therein;

a respective chunk test result bus associated with each of said electronic circuitry chunks;

an integrated-circuit test result bus;

a respective number of gates associated with each of said electronic circuitry chunks by being connected respectively for selectively applying the bit conditions at the bit connections of the test input port of that said chunk to the corresponding further bond pad, which selective applying is done only responsive to the first chunk selection signal of said chunk being in a first logic state or to said test enable signal being in a second logic state;

a respective number of further gates associated with each of said electronic circuitry chunks by being connected respectively for selectively applying to the bit connections of the test input port of that said chunk the bit condition at a respective connection of the test vector port, which selective applying is done only responsive to the second chunk selection signal of that said chunk and said test enable signal concurrently being in a first logic state;

a respective number of tristate drivers associated with each of said electronic circuitry chunks by being connected respectively for selectively applying the bit conditions at the bit connections of the test output port of that said chunk to the corresponding further bond pad, which selective applying is done only responsive to the third chunk selection signal of that said chunk being in its first logic state or to said test enable signal being in its second logic state;

a respective further number of tristate drivers identified by consecutive ordinal numbers beginning at first, associated respectively with each of said electronic circuitry chunks by being connected respectively for selectively applying to said associated chunk test result bus the bit conditions at the further bond pads corresponding to the bit connections of each test output port of that said chunk, which selective applying is done only responsive to a further control signal identified by the same ordinal number as the tristate driver being in a first logic state;

a respective still further tristate driver associated respectively with each of said electronic circuitry chunks by being connected respectively for selectively applying the bit condition at said associated chunk test result bus to said chip test result bus, which selective applying is done only responsive to the fourth chunk selection signal of that said chunk being in a first logic state;

means responding to said test clock signal received at said eighth bond pad for generating a shift register clocking signal;

a segment of a zeroeth shift register having a serial data input port connected from said fourth bond pad, having a serial data output port connected to said fifth bond pad, having a clocking signal input port, and having first and second shift register stages in cascade connection between its serial data input port and serial data output port, the signal stored in its first shifter stage being a chip selection signal in a first logic state thereof and a chip deselection signal in a second logic state thereof, the signal stored in its second shifter stage being a chip output enable signal in a first logic state thereof and a chip output disable signal in a second logic state thereof;

means responding to a first instruction code being applied to said ninth, tenth and eleventh bond pads for selectively applying said shift register clocking signal in its entirety to the clocking signal input port of said segment of a zeroeth shift register;

another tristate driver for selectively applying the bit condition on said test result bus to said sixth bond pad, which selective applying is done only responsive to said test enable signal being its first logic state simultaneously with said chip output enable signal being available;

a first shift register having a serial data input port connected from said seventh bond pad, having a clocking signal input port, having a parallel data output port with M bit connections therein respectively identified by consecutive ordinal numbers first through $M^{th}$, having a multiple of M shift register stages therein respectively identified by consecutive ordinal numbers beginning with first, having means responsive to a third instruction code being applied to said ninth and tenth and eleventh bond pads for cascading after said serial data input port its shift register stages in order of their ordinal numbering, and having means for otherwise cascading each set of its shift register stages having the same ordinal number modulo M in a respective ring including the connection of its parallel data output port identified by the same ordinal number modulo M;

means responsive to either said third or said fourth instruction code appearing on said ninth, tenth and eleventh bond pads simultaneously with said chip selection signal being available, for applying said shift register clocking signal to the clocking signal input port of said first shift register;

a second shift register having a serial data input port connected from said seventh bond pad, having a clocking signal input port and having a plurality of shift register stages N in number in cascade connection after its serial data input port, which shift register stages are identified by respective ones of consecutive ordinal numbers first through $N^{th}$ according to the order of their cascade connection, the signal stored in each of which shift register stages being said further control signal identified by the same ordinal number that shifter stage is;

means responding to said chip output enable signal being available simultaneously with a second instruction code being applied to said ninth, tenth and eleventh bond pads, for selectively applying said shift register clocking signal in its entirety to the clocking signal input port of said second shift register;

a third shift register having a serial data input port connected from said seventh bond pad, having a clocking signal input port and having a plurality of shift register stages M in number in cascade connection after its serial input port, which shift register stages are identified by respective ones of consecutive ordinal numbers first through $M^{th}$ assigned according to their order of their cascade connection;

means responding to said chip selection signal being available simultaneously with a fifth instruction code being applied to said ninth, tenth and eleventh bond pads, for selectively applying said shift register clocking signal in its entirety to the clocking signal input port of said third shift register, a number M of still other tristate drivers for selectively connecting each connection in the parallel data output port of said first shift register to a respective one of the connections of said test vector port, responsive to the signal stored in a corresponding one of the first through $M^{th}$ stages of said third register being in a first logic state;

means for applying a prescribed bit value to each of the connections of any said test input port absent any selective connection thereto from said first shift register;

a fourth shift register having a serial data input port connected from said seventh bond pad, having a clocking signal input port, and having within a cascade connection of shift register stages after its serial data input port a respective succession of fourth shift register stages corresponding to each electronics circuitry chunk, the shift register stages in each succession being identified by consecutive ordinal numbers first through fourth assigned in order of their succession, the chunk selection signals for each said electronics circuitry chunk being supplied from different ones of the corresponding succession of shifter stages in said fourth shift register, similarly numbered chunk selection signals for said electronics circuitry chunks being thus supplied all from shift register stages in said fourth shift register that are identified by the same ordinal number; and means responding to said chip selection signal being available simultaneously with a sixth instruction code being applied to said ninth, tenth and eleventh bond pads, for selectively applying said shift register clocking signal in its entirety to the clocking signal input port of said fourth shift register.

13. An integrated circuit as set forth in claim 12 wherein the first and second shift register stages in said segment of a zeroeth shift register are its initial and final shift register stages, respectively.

14. An integrated circuit as set forth in claim 12 wherein said first, second and third shift stages in each said succession of shift stages in said fourth shift register respectively supply the first, second and third chunk selection signals to the corresponding electronics circuitry chunk.

15. An integrated circuit as set forth in claim 12 that is a monolithic chip.

16. A plurality of integrated circuits as set forth in claim 15 included in an electronics system that can be tested using the built-in test circuitry of said integrated circuits and that further includes:

a connection together of the third bond pads of said chips;

connections to the fourth bond pads of said chips and from the fifth bond pads of said chips for connecting the segments of said zeroeth shift registers of said chips together to form said zeroeth shift register;

a connection together of the sixth bond pads of said chips;

a connection together of the seventh bond pads of said chips;

a connection together of the eighth bond pads of said chips;

a connection together of the ninth bond pads of said chips;

a connection together of the tenth bond pads of said chips; and a connection together of the eleventh bond pads of said chips.

17. On-chip apparatus for supplying a series of input test vectors to each input port of chunks of electronic circuitry disposed within a monolithic integrated circuit chip, there being output ports of said chunks of electronic circuitry which connect to more than one of said input ports, said on-chip apparatus comprising:

a plurality M in number of shift registers identified by consecutive ordinal numbers first through $M^{th}$, each of said first through $M^{th}$ shift registers having a respective serial input port, a respective serial output port, and a respective plurality N in number of bit-storing shifter stages in cascade connection between its serial input port and its serial output port;

means responsive to the presence of a first load instruction or to a circulation instruction for selectively applying clock signals to the shifter stages of said first through $M^{th}$ shift registers;

means, responding to the presence of said first load instruction, for connecting the serial input port of said first shift register to receive a series of bits descriptive of said series of input test vectors;

means responding to the presence of said first load instruction for connecting the serial input port of each of said second through $M^{th}$ shift registers to the serial output port of the shift register segment with next lower ordinal number, means, responding to the absence of said first load instruction signal, for connecting the serial input port of each of said first through $M^{th}$ shift registers to its own serial output port; and means for extracting a parallel output signal from the serial output ports of said first through $M^{th}$ shift registers.

18. On-chip apparatus as set forth in claim 17 wherein said means for extracting a parallel output signal comprises:

a plurality M in number of tristate drivers connected to respond selectively to respective input bits supplied from respective ones of the serial output ports of said first through $M^{th}$ shift registers to generate a respective output bit, either from a relatively high source impedance or from a relatively low source impedance as determined by a respective control signal applied thereto;

an $(M+1)^{th}$ shift register having a respective serial input port and a respective plurality M in number of bit-storing shifter stages in cascade after its serial input port, the bit stored within each of which shifter stages providing the control signal for a respective one of said tristate drivers; and means responsive to the presence of a second load instruction for selectively applying clock signals to the shifter stages of said $(M+1)^{th}$ shift register.

19. On-chip apparatus as set forth in claim 18 wherein said first and said $(M+1)^{th}$ shift registers have their serial input ports connected in parallel.

* * * * *